(12) United States Patent
Palm et al.

(10) Patent No.: US 11,850,825 B2
(45) Date of Patent: Dec. 26, 2023

(54) COLORED FACADE ELEMENT WITH COMPOSITE PANE STRUCTURE

(71) Applicant: CNBM RESEARCH INSTITUTE FOR ADVANCED GLASS MATERIALS GROUP CO., LTD., Bengbu (CN)

(72) Inventors: Joerg Palm, Munich (DE); Lutz Tautenhahn, Dresden (DE)

(73) Assignee: CNBM RESEARCH INSTITUTE FOR ADVANCED GLASS MATERIALS GROUP CO., LTD., Bengbu (CN)

( * ) Notice: Subject to any disclaimer, the term of this patent is extended or adjusted under 35 U.S.C. 154(b) by 0 days.

(21) Appl. No.: 17/795,601

(22) PCT Filed: Jan. 25, 2021

(86) PCT No.: PCT/CN2021/073499
§ 371 (c)(1),
(2) Date: Jul. 27, 2022

(87) PCT Pub. No.: WO2021/151373
PCT Pub. Date: Aug. 5, 2021

(65) Prior Publication Data
US 2023/0085983 A1    Mar. 23, 2023

(30) Foreign Application Priority Data
Jan. 28, 2020  (EP) ..................... 20153987

(51) Int. Cl.
*B32B 3/26*  (2006.01)
*B32B 3/30*  (2006.01)
(Continued)

(52) U.S. Cl.
CPC ............ *B32B 17/1011* (2013.01); *B32B 7/03* (2019.01); *B32B 7/12* (2013.01);
(Continued)

(58) Field of Classification Search
CPC ......... B32B 3/30; B32B 3/26; B32B 17/1011; B32B 17/10449; B32B 2307/4026;
(Continued)

(56) References Cited

U.S. PATENT DOCUMENTS

| 6,384,318 | B1 * | 5/2002 | Nomura | H01L 31/048 |
| | | | | 136/246 |
| 2010/0181014 | A1 * | 7/2010 | Raymond | G02B 17/086 |
| | | | | 156/209 |

(Continued)

FOREIGN PATENT DOCUMENTS

| CN | 108698379 A | 10/2018 |
| CN | 109642121 A | 4/2019 |

(Continued)

OTHER PUBLICATIONS

DIN 18516-1, Cladding for External Walls, Rear-Ventilated Part 1: Requirements, Principles of Testing, German Standard, 1999, pp. 1-12, Price Group 08 Contract No. 0008.

(Continued)

*Primary Examiner* — Joanna Pleszczynska
(74) *Attorney, Agent, or Firm* — Bayramoglu Law Offices LLC

(57) ABSTRACT

A facade element includes a coloring transparent or semi-transparent first pane and a mechanically supporting transparent second pane firmly connected to one another by an intermediate layer. The first pane has a front surface arranged on the light incidence side and an opposite back surface, at least one surface of the front and back surfaces has at least one structured region, and at least one optical (Continued)

interference layer is arranged on the at least one surface for reflecting light within a predetermined wavelength range. The structured region has the following features:

perpendicular to the plane of the first pane, a height profile comprising peaks and valleys, wherein an average height difference between the peaks and valleys is at least 2 µm, at least 50% of the structured region is composed of segments which are inclined with respect to the plane of the first pane (2).

18 Claims, 20 Drawing Sheets

(51) Int. Cl.
  *B32B 17/10* (2006.01)
  *B32B 7/03* (2019.01)
  *B32B 7/12* (2006.01)

(52) U.S. Cl.
  CPC .... *B32B 17/10449* (2013.01); *B32B 2250/02* (2013.01); *B32B 2307/4026* (2013.01); *B32B 2307/412* (2013.01); *B32B 2307/416* (2013.01); *B32B 2307/514* (2013.01); *B32B 2315/08* (2013.01); *B32B 2457/12* (2013.01)

(58) Field of Classification Search
  CPC ........ B32B 2307/412; B32B 2307/416; B32B 2457/12; H01L 31/054; H01L 31/049; H01L 31/0547; H01L 31/02168; H01L 31/0236; H01L 32/02366
  See application file for complete search history.

(56) References Cited

U.S. PATENT DOCUMENTS

| | | | |
|---|---|---|---|
| 2012/0183734 A1* | 7/2012 | Schiavoni | H01L 31/0392 264/319 |
| 2013/0118579 A1* | 5/2013 | Konishi | H01L 31/046 136/256 |
| 2014/0104690 A1 | 4/2014 | Sandre-Chardonnal et al. | |
| 2015/0303318 A1* | 10/2015 | Tanaka | H01L 31/0682 252/384 |
| 2016/0064577 A1 | 3/2016 | Ballif et al. | |
| 2017/0033250 A1 | 2/2017 | Ballif et al. | |
| 2018/0337630 A1* | 11/2018 | Plummer | E06B 3/66314 |

FOREIGN PATENT DOCUMENTS

| | | |
|---|---|---|
| EP | 2793271 A1 | 10/2014 |
| EP | 2897795 A2 | 7/2015 |
| EP | 2900471 A1 | 8/2015 |
| EP | 3129810 A1 | 2/2017 |
| EP | 3599318 A1 | 1/2020 |
| EP | 3599647 A1 | 1/2020 |
| EP | 3599649 A1 | 1/2020 |
| JP | 2003124491 A | 4/2003 |
| JP | 2013048222 A | 3/2013 |
| JP | 2013114073 A | 6/2013 |
| JP | 2014509963 A | 4/2014 |
| JP | 2018522284 A | 8/2018 |
| WO | 2015155356 A1 | 10/2015 |
| WO | 2018154045 A1 | 8/2018 |

OTHER PUBLICATIONS

DIN EN 13830, Curtain walling-Product standard, CEN, 2003, pp. 1-23.

CIE DS 014-4.3/E, Colorimetry—Part 4: CIE 1976 L*a*b* Colour Space, CIE Draft Standard, 2007, pp. 1-8.

DIN 5033-9, Colorimetry—Part 9: Reflectance standard for calibration in colorimetry and photometry, 2018, pp. 1-12.

ISO/CIE 10527, CIE standard colorimetric observers, International Standard, 1991, pp. 1-6.

ISO 7724/ 1, Paints and varnishes—Colorimetry—Part 1: Principles, International Standard, 1984, pp. 1-5.

ASTM Designation: E 1347-97, Standard Test Method for Color and Color-Difference Measurement by Tristimulus (Filter) Colorimetry, ASTM, 1997, pp. 1-4.

ASTM Designation: D 1003-00, Standard Test Method for Haze and Luminous Transmittance of Transparent Plastics, ASTM, 2000, pp. 1-6.

* cited by examiner

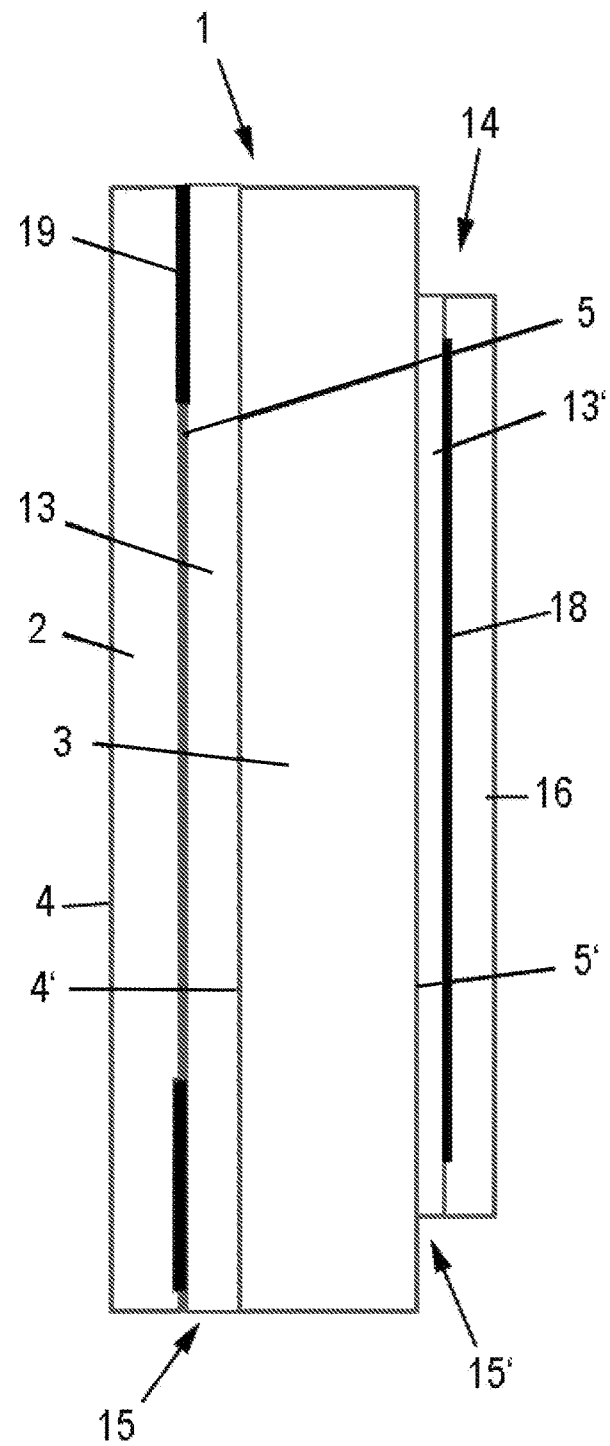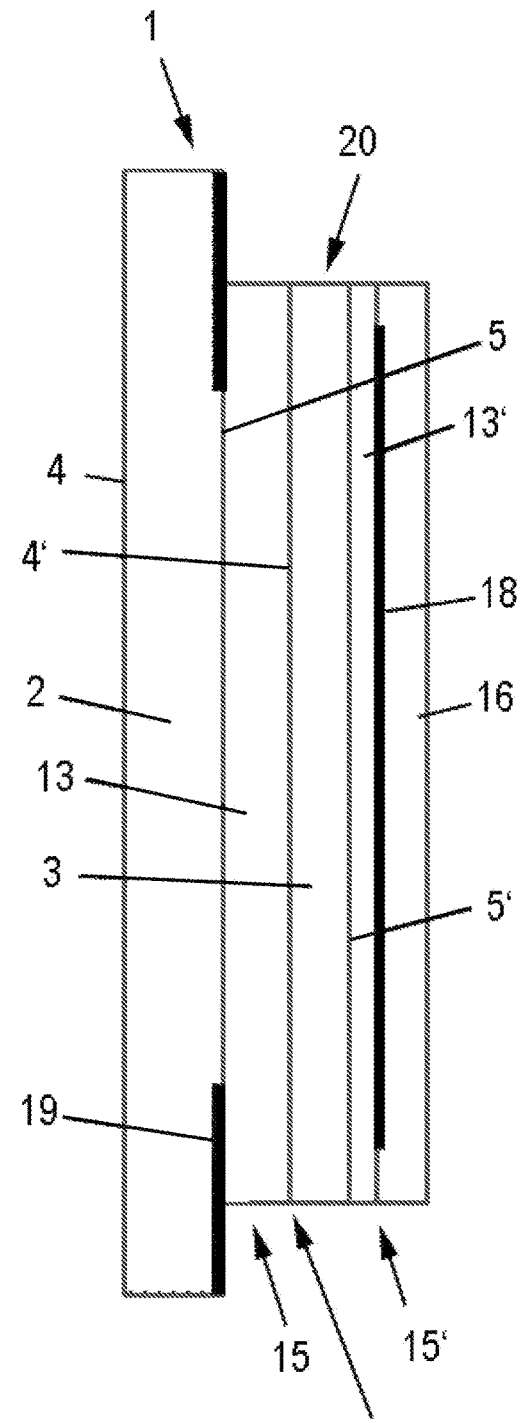

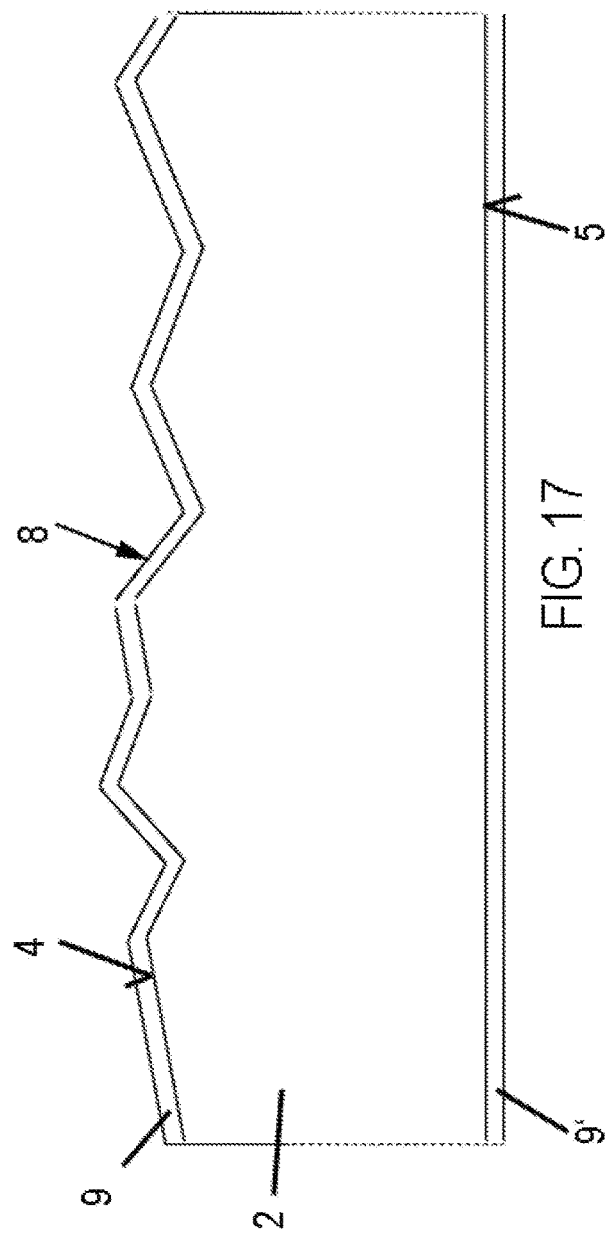
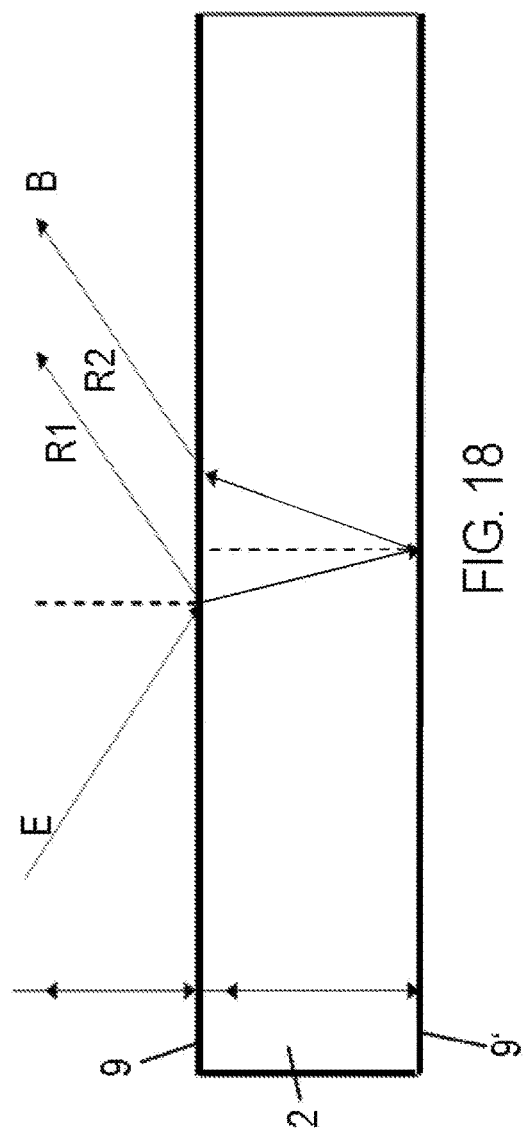

COLORED FACADE ELEMENT WITH COMPOSITE PANE STRUCTURE

CROSS REFERENCE TO THE RELATED APPLICATIONS

This application is the national phase entry of International Application No. PCT/CN2021/073499, filed on Jan. 25, 2021, which is based upon and claims priority to European Patent Application No. 20153987.1, filed on Jan. 28, 2020, the entire contents of which are incorporated herein by reference.

TECHNICAL FILED

The present invention is in the technical field of facade manufacturing and relates to a colored facade element with a composite pane structure.

BACKGROUND

The use of solar modules as wall or facade elements is currently still a relatively small market in economic terms, but a very interesting one in ecological terms. Especially in view of increased efforts for decentralized energy solutions and energy-neutral buildings, the demand for the application of solar modules as integrated components of building envelopes is growing. Other interesting applications for solar modules include noise barriers (road, rail), outdoor privacy walls and walls for greenhouses. These new applications place completely new demands on solar modules, particularly with regard to aesthetics, service life and other functionalities such as sealing and thermal insulation. In particular, the solar modules used for this purpose must be available in different shapes, sizes and colors and must convey a color impression as homogeneous as possible. Depending on the origin of the color (absorption/remission, interference, refraction), the color of an intrinsically homogeneous surface of the solar module can depend on the viewing and/or irradiation angle. In addition, the spectrum and the spatial distribution (diffuse, directional) of the light also determine the color impression.

In terms of efficiency optimization, an ideal solar module would be a black body that completely absorbs the incident sunlight in order to optimally convert the radiant energy into electrical energy. However, every real body reflects incident radiation and remits absorbed radiation, whereby the color impression in the human eye basically results from the spectrally selected reflection and remission of light. The solar spectrum has the highest energy intensity and the human eye has the greatest sensitivity in the visible spectral range. If a solar module is designed in color, i.e., if the human eye is to be given a color impression of the solar module that is different from the ideal black body, the intensity of the light absorbed in the photovoltaically active semiconductor is necessarily reduced and thus also the electrical output or the efficiency of the solar module. Optimum efficiency can basically only be achieved with a black solar module. On the other hand, depending on the origin of the color (absorption/remission, interference, refraction), the color of an intrinsically homogeneous surface of the solar module can depend on the viewing and/or irradiation angle. Furthermore, the spectrum and the spatial distribution (diffuse, directional) of the light also determine the color impression.

In the non-published European patent applications EP 18186153.5 and EP18186161.8, solar modules are shown in which coloration is achieved by at least one optical interference layer. By structuring the front glass, a colored solar module is obtained which has a color effect that is largely stable for the human eye even from different viewing directions and under different lighting conditions, while still achieving an acceptable energy yield, in particular a good efficiency.

The specific dimensioning of a facade may require colored solar modules in different sizes and shapes to give the facade a color as homogeneous as possible. In general, smaller and non-rectangular solar modules lead to considerable additional costs if the actual half-conductor stack is produced over a large region and smaller module sizes have to be produced by dividing, since smaller solar modules require a significantly higher material input per unit of output power. In addition, the ratio of module region to module edge is less favorable for smaller solar modules, so that the overall module efficiency is also lower. Furthermore, the costs of certain materials and fixed costs for add-on parts and edge sealing have a higher share of the total costs for small solar modules. Furthermore, certain steps of the manufacturing process can only be implemented with heavily modified equipment concepts for different substrate sizes.

For the above-mentioned reasons, industrial series production of solar modules is directed to a few standard module sizes and, as a rule, the rectangular shape of the solar modules, so that covering of the entire surface of a facade with solar modules is usually not possible or economically unacceptable. In addition, the photovoltaic design of the solar cells and various add-on parts such as contact strips, junction boxes and cables are optimized for the standard module sizes. Furthermore, due to unfavorable orientation to the sun or shading by parts of the same building or by neighboring buildings, it may be uneconomical to cover certain regions of a facade with solar modules, since their energy yield does not justify the additional costs.

To solve the problem of lack of suitable sizes and/or shapes of colored solar modules, it is conceivable to use photovoltaically passive facade elements made of sheet metal or other conventional building materials, and it is understood that their color should be as similar as possible to that of the colored solar modules. However, there is a technical and design problem that lies in the nature of color generation. In fact, depending on the origin of the color (absorption/emission, interference, refraction), the color of the solar modules can change under different lighting conditions, in particular depending on the type of light (diffuse, direct, light color), as well as by changing the angle of incidence and/or observation. If the photovoltaically passive facade elements are made of materials other than the colored solar modules, this typically results in color contrasts that are undesirable from a design point of view.

A solution to this problem can be found in the unpublished European patent application EP 18186175.8. It shows photovoltaically passive facade elements in which, analogous to the unpublished European patent applications EP 18186153.5 and EP18186161.8, the front glass is structured and at least one optical interference layer is provided.

In the case of curtain-type back-ventilated facades, the facade element is separated from the structures behind it by a layer of air. According to DIN 18516-1, such a construction consists of facade cladding, back ventilation zone, thermal insulation and substructure. The prerequisite is a statically supporting anchoring base. The thermal insulation is also ventilated to allow condensation to dry off. Various facade cladding materials are possible, including wood, metal, composite materials and colored glass panels, which are fastened by means of line brackets, point brackets or clamps. Solar modules with a 3-4 mm thick front glass, a 2 mm thick substrate glass with CIGS thin-film solar cells in monolithic series interconnection and bonded back rails, as marketed by the applicant, are also particularly suitable as facade elements.

As an alternative to the curtain-type back-ventilated facade, curtain walls are also widely used. From a structural point of view, the post-beam facade, together with the element facade, belongs to the curtain wall facades. Curtain wall facades are self-supporting and, as far as possible, do not take on any further structural loads from other parts of the building. Their substructure is attached to the primary supporting structure of a building. The product standard DIN EN 13830 (curtain facades) defines the general requirements for a post-beam facade. The post-beam facade can be used to create large openings as well as entire facade regions. Due to variable profile dimensions, especially in profile depth, and the use of different materials, such as wood, steel or aluminum, the constructions can be adapted to almost any installation situation, especially since different materials can be selected as infill, such as insulating glass and solar modules. The modular design of the post-beam facade allows both prefabrication of the elements in the factory (element facade) and their connection on site at the construction site. The construction is based on the connection of vertical post profiles (main profiles) and horizontal beam profiles, which together form a skeleton-like load bearing structure. The main load transfer takes place via the vertical posts. The beams are either screwed, plugged or welded to these. Infills can be made of transparent or opaque materials. Elastic sealing elements are used between facade fields and the supporting facade framework.

Also of interest is the installation of solar modules in large window walls. These can be integrated into exterior walls with different construction forms (e.g., also between masonry exterior walls). For example, the solar modules can be installed as opaque elements in floor-to-ceiling window elements. Alternatively, in a window element there is a photovoltaically active segment in the lower region and a transparent segment in the upper region.

When integrating solar modules as facade elements in a curtain-wall back-ventilated facade, a curtain wall or a window wall, the following requirements should be met:

Homogeneous Color Effect:

For static, but also for economic reasons, the facade elements should have a certain minimum size. The size should be variable according to both static and architectural-aesthetic aspects. This requirement may conflict with the sizes available from solar module production. In the case of thin-film solar modules, only certain widths and lengths are generally available for technical production reasons. Therefore, for larger regions, several modules must be integrated next to or below each other in a facade element for post-beam construction. In between, there are regions (contact strips, edge regions to insulation, etc.) that have a color effect different from the photovoltaically active region. For solar modules in silicon wafer technology, there are also regions (contact grid, contact bands, spaces between cells) that have a color effect different from the actual cells. In addition, both thin film solar cells and silicon wafer solar cells have a defined color effect of their own (gray, blue or black). The actual cell surface and the non-active regions should be homogeneously covered with a uniform color, as arbitrary as possible according to the user's wishes. The loss of efficiency must not be too high, otherwise the energy yield of the facade will be too low.

Mechanical Stability:

Solar modules usually consist of glass composites (tempered and/or non-tempered) with relatively thin glass thicknesses, for example, 3 mm toughened safety front glass plus 2 mm non-tempered substrate glass in a CIGS thin-film solar module, or 4 mm toughened front glass plus back pane in standard silicon solar modules. These glass thicknesses are usually not sufficient for the infills of a post-beam glass structure or for a panel for cladding a back-ventilated curtain wall, especially for taller buildings and/or higher wind load zones. For taller building heights, the requirements for wind resistance increase, and it is desirable to advance to higher wind load zones and building heights.

Climate Stability:

Unlike conventional facade materials, solar modules consist of electronic components (essentially large-region semiconductor diodes and their contact elements) that must be protected against moisture and other environmental influences. This is usually ensured by suitable encapsulation materials and edge seals.

Manufacturing Costs:

Until now, building-integrated solar modules have mostly been manufactured manually or semi-automatically. This leads to relatively high manufacturing costs. Building-integrated photovoltaics can only become a sustainably growing field of application if the manufacturing costs on the one hand and the yields through energy generation on the other hand leads to an acceptable payback time for the additional costs of the facade.

Efficiency:

In order for facade integration to achieve an acceptable payback time for the additional costs of the facade due to the electrical energy yield, the efficiency and the year-round averaged energy yield must not be too low.

SUMMARY

In contrast, the object of the present invention is to provide a colored facade element with a composite pane structure that takes into account the above requirements. In particular, the color of the facade element should depend as little as possible on the lighting conditions and on the viewing and irradiation angle. The facade element should be producible in different sizes and shapes at acceptable costs and with satisfactory homogeneity. In addition, it should meet increased requirements for wind resistance, so that it can be used in zones with higher wind loads and at greater building heights.

These and further objects are solved according to the proposal of the invention by a facade element with the features of the independent claim. Advantageous embodiments of the invention are indicated by the features of the subclaims.

According to the invention, a colored facade element with a composite pane structure is shown.

The term "facade element" generally refers to a component which is suitable and intended to be installed as a visible surface element in a facade. Generally, the facade has a front or exterior side and a back or interior side, wherein the front side of the facade may be viewed from the exterior environment. The facade is, for example, a building wall or a free-standing wall that serves, for example, as a visual or noise barrier. The facade element can be integrated into a facade as an independent component, whereby the front surface of the facade element is part of the exterior or front surface of the facade. The front or outer side of the facade element is used for the incidence of light (e.g., sunlight) on the facade element. The back or inner side of the facade element is not used for viewing from the external environment, nor is it used for the incidence of light.

By "colored" facade element" or "facade element with color effect" is meant that the front or outer side of the facade element has a certain (selectable) color when exposed to light (e.g. sunlight).

By "composite pane structure" it is to be understood that the facade element has at least two panes that are firmly connected (e.g., laminated) to each other by an intermediate layer.

The facade element may be photovoltaically active (i.e., suitable and intended for photovoltaic electricity generation). However, contrary thereto, it is also possible for the facade element to be photovoltaically passive.

According to the invention, a facade element with color effect is shown comprising a transparent or semitransparent first pane and a transparent second pane, which are firmly connected to each other by a transparent intermediate layer. The first and second panes form a composite pane. The intermediate layer is preferably a thermoplastic or cross-linking polymer intermediate layer (e.g., PVB=polyvinyl butyral or EVA=ethylene vinyl acetate), which bonds the two panes together. Bonding is also possible using a transparent silicone or casting resin.

For the purposes of the present invention, the term "transparency" or "transparent" refers to a visible light transmittance of at least 85%, in particular at least 90%, preferably at least 95%, in particular 100%. Typically, visible light is present in the wavelength range from 380 nm to 780 nm. The term "opacity" or "opaque" refers to a visible light transmittance of less than 5%, in particular 0%. The term "semi-transparent" or "semi-transparent" refers to a visible light transmittance of less than 85% and at least 5%. The percentages refer to the intensity of the light, in each case measured on one side of the two-dimensional structure (e.g., pane) to be examined, relative to the intensity of the light impinging on the other side of the two-dimensional structure. For such a measurement, for example, a white light source (visible light source) can be placed on one side of the planar structure and a visible light detector on the other side of the planar structure. The values given below for the optical refractive index always refer to the optical refractive index in the visible wavelength range from 380 nm to 780 nm.

In the facade element according to the invention, the transparent or semitransparent first pane is used for coloring, as will be explained in more detail below. Since the first pane has a colored reflection, it is no longer completely transparent. For darker and more unsaturated colors, the visible light transmittance can still be more than 85%, but for lighter and more saturated colors it is usually less than 85%. The transparent second pane is not used for coloring but for mechanical support or reinforcement of the facade element, so that the facade element also meets greater requirements for wind resistance.

The coloring first pane has a front (i.e., front-sided) surface arranged on the light incidence side and an opposite back (i.e., back-sided) surface. The front surface of the first pane thus faces the external environment from which the front or outer side of the facade element can be viewed. Accordingly, the back surface of the first pane faces away from the external environment.

According to an embodiment of the facade element according to the invention, the panes of the facade element are made of a same material, for example glass or plastic, preferably soda-lime glass. Preferably, the panes are each formed as a rigid glass or plastic pane. In this case, the front surface or back surface of a pane is formed by the respective material of the pane. According to an alternative embodiment, a pane may comprise at least two different materials, wherein the front surface and/or back surface of the pane is formed from a material different from a core of the pane. The core of the pane is preferably made of a same material, for example glass or plastic, preferably soda-lime glass. A material which is different from the core of the pane is applied to the outside and/or inside of the core of the pane, which material is transparent and has the same optical refractive index as the material of the core of the pane. In this case, the front surface or back surface of the pane is formed by the respective material applied to the core of the pane. According to the invention, the term "pane" thus also includes composite bodies, with the proviso that the materials forming the pane are non-absorbent and have the same optical refractive index.

Preferably, the panes of the facade element have no curvature and are thus planar (flat). However, the panes may also be curved. The panes may be rigid or flexible. A flexible pane can also be provided in a planar form. In the case of a planar (flat) pane, a plane is defined by the pane itself, which is to be understood as the "plane of the pane" in the sense of the invention. In the case of a curved pane, a local plane can be defined by an (imaginary) tangential plane at any point of the pane, which also comes under the term "plane of the pane".

The facade element according to the invention gives the observer a homogeneous color impression in at least one section when illuminated from the outside with white light, in particular when illuminated with sunlight, i.e., the facade element is colored. Preferably, the colored section extends over the entire front surface of the facade element. Facade elements with a homogeneous color impression over the entire surface are considered particularly attractive.

The color of the facade element can be described by three color coordinates $L^*$, $a^*$, $b^*$, whereby the color coordinates refer to the $(CIE)L^*a^*b^*$ color space known to the skilled person per se, in which all perceptible colors are exactly defined. This color space is specified in the European standard EN ISO 11664-4 "Colorimetry—Part 4:CIE 1976 $L^*a^*b^*$ Color space", to which full reference is made in the present description. In the $(CIE)L^*a^*b^*$ color space, each color is defined by a color location with the three Cartesian coordinates $L^*$, $a^*$, $b^*$. On the $a^*$ axis, green and red are opposite each other, the $b^*$ axis runs between blue and yellow, and the $L^*$ axis describes the brightness (luminance) of the color. For a more descriptive representation, the quantities can be converted to the Lhc color space, where L remains the same and saturation is the radius and h is the angle of a color point in the $a^*b^*$ plane.

The color of the facade element refers to a view from the external environment, i.e., in view on the front-side pane. The color measurement or the determination of the color coordinates of the facade element can be done in a simple manner by a commercially available colorimeter (spectrophotometer). For this purpose, the color measuring device is directed at the front surface of the front-sided pane, in particular placed on the front surface. Common color measuring devices allow color measurement in accordance with standards, whereby their design and tolerances are typically subject to international standards, for example defined by DIN 5033, ISO/CIE 10527, ISO 7724 and ASTM E1347. For example, with regard to color measurement, reference is made in full to the DIN 5033 standard. A color measuring device has as a light source, for example, a xenon flash lamp, tungsten halogen lamp or one or more LEDs, whereby the front surface of a body is illuminated with the generated light (e.g., white light) and the light received by the facade element is measured. As explained before, the body color measured by the colorimeter results from the light which is reflected and remitted from the facade element.

In order to achieve that the facade element according to the invention has a homogeneous color at least in one section, at least one surface (i.e., front surface and/or back surface) of the color-imparting first pane has at least one structured region. In addition, at least one color-imparting optical interference layer is disposed on the first pane. The at least one optical interference layer makes the first pane a color-giving first pane.

The at least one optical interference layer serves to reflect light within a predetermined or predeterminable wavelength range The at least one optical interference layer is preferably arranged directly (i.e., without any further intermediate layer) on a surface of the first pane.

The at least one optical interference layer can be of single-layer or multi-layer design, i.e., have one or more light-refracting layers (refraction layers). The optical interference layer is used to generate the color of the first pane and thus of the facade element, the optical interference layer being designed in such a way that constructive or destructive interference of light reflected at the various interfaces of the optical interference layer is possible. The color of the facade element results from the interference of the light reflected at the interfaces of the optical interference layer. When illuminated with (white) light, in particular sunlight, the optical interference layer acts as a color filter to produce a homogeneous color. Preferably, the structured region extends over the complete first pane, i.e., over the complete surface (front surface and/or back surface) of the first pane, so that the complete facade element has a homogeneous color. The facade element can also have several facade element sections, each with a homogeneous color. The colors of the facade element sections may be the same or different from each other.

The at least one structured region has a height profile perpendicular to the plane of the color-giving first pane with peaks (elevations) and valleys (depressions), wherein an average height difference between the peaks and valleys is at least 2 μm and preferably, but not necessarily, at most 20%, preferably at most 10%, more preferably at most 5%, of a thickness of the transparent or semi-transparent first pane. Furthermore, at least 50%, preferably at least 80%, more preferably at least 90%, of the structured region of the surface (front and/or back surface) is composed of differently inclined segments or facets. The segments are sections of the surface of the coloring first pane facing the outer environment and are each formed as planar surfaces which are inclined relative to the plane of the coloring first pane. Here, with respect to the plane of the coloring first pane, at least 20% of the segments have an angle of inclination in the range from greater than 0° to a maximum of 15° and at least 30% of the segments have an angle of inclination in the range from greater than 15° to a maximum of 45°. Advantageously, but not necessarily, less than 30% of the segments have an angle of inclination greater than 45°. The structures are preferably non-periodic and anisotropic. However, periodic structures and anisotropic structures can also be used for special optical effects.

Furthermore, the segments are each flat (planar) and have a segment area of at least 1 μm². Further, in at least one zone (i.e., sub-region) of the structured region, the segments each have an average roughness of less than 15%, preferably less than 10%, more preferably less than 5%, of a layer thickness of the optical interference layer applied to the structured region. If the optical interference layer consists of a plurality of refractive layers, the segments of the at least one zone each have an average roughness of less than 15% of a layer thickness of the refractive layer having the smallest layer thickness. The zone in which the segments each have an average roughness of less than 15% of a layer thickness of the optical interference layer may correspond to the structured region, i.e., the zone and the structured region are then identical. The structured region may be produced, for example, by etching, sandblasting or rolling of the first pane.

Accordingly, the at least one structured region of the color-imparting first pane of the facade element has a plurality of planar (flat) segments. In the sense of the present invention, planar segments may be formed by non-curved surfaces. However, it is also possible that flat (plane) segments are formed by slightly curved surfaces. A segment is slightly curved in the sense of the present invention, if for each point of the segment the following applies: if at a point of the segment an (imaginary) tangential plane with a region of 1 μm² is constructed, the distance between the region of the segment and the tangential plane, referred to the normal direction to the tangential plane, is less than 50 nm.

For the purposes of the present invention, the term "structuring" or "structured region" in the context of the facade element means a region of the front surface or back surface of the color-imparting first pane in which the above-described features are present in combination.

By the features of the structured region, it can be achieved in an advantageous manner that, when the coloring first pane is illuminated with light, light is reflected back with relatively high intensity even when observed outside the gloss angle (angle of incidence of the incident light corresponds to angle of reflection of the reflected light, relative to the plane of the coloring first pane). The reason for this is the differently inclined segments, which are present in sufficient number, suitable size and suitable inclination angles to enable a high intensity of the reflected light even when observed outside the gloss angle. There are always a sufficient number of tilted segments that, when having a structured region externally by refraction at the segments and when having a structured region internally by reflection at the segments, scatter sufficient intensity in directions outside the gloss angle of the color-providing first pane.

As used herein, the term "gloss angle" refers to the normal to the plane of the coloring first pane, as opposed to the "local gloss angle" which refers to the normal to the plane of a segment. Gloss angle and local gloss angle can be the same (segment is parallel to the plane of the coloring first pane), but are usually different (segment is inclined to the plane of the coloring first pane).

As a result, the intensity of the light not reflected (i.e., scattered) in the gloss angle can be relatively high, which, compared to a reflective surface without such a structured region, has only a low angular dependence with respect to the direction of incidence and observation. By means of the optical interference layer, the light reflected outside the gloss angle can be subjected to color selection, depending on the refractive index and layer thickness of the optical interference layer, so that the surface of the coloring first pane has a homogeneous color with relatively low angular dependence. The interference layer acts as a filter with narrow-band reflection and broad-band transmission.

Advantageously in this respect, the structured region has a height profile in which an average height difference between the peaks and valleys is at least 2 μm, preferably at least 10 µm and particularly preferably at least 15 µm. Such a structured region can be produced by etching the first pane (e.g., of glass). Equally advantageously in this respect, the structured region has a height profile in which an average height difference between the peaks and valleys is at least 50 µm, preferably at least 100 µm. Such a textured region can be produced by rolling the coloring first pane (e.g., of glass). Accordingly, the invention advantageously extends to a facade element whose at least one structured region of the coloring first pane is produced by etching or rolling, whereby said height profiles are producible.

However, the structures can also be produced by applying a transparent and structured layer to the coloring first pane. In this case, the layer must have the same (or at least very similar) refractive index as the first pane. According to the invention, the structuring of a surface of the coloring first pane shall also comprise the application of such a transparent and structured layer.

Said properties of the structured region of the coloring first pane can be measured by conventional measuring devices, such as a microscope, in particular a confocal microscope or a needle profilometer.

Preferably, the at least one structured region of the (uncoated) first pane of the facade element according to the invention achieves that a brightness L of the reflected light of at least 10 occurs at observation angles of 45° and 15° (in each case referred to the plane of the first pane) and an angle of incidence which deviates by 45° from the respective gloss angle (in both directions). Preferably, a brightness L of the reflected light of at least 15 and more preferably at least 20 occurs. In this measurement, a black cover is applied to the side (i.e., back surface) of the (uncoated) first pane facing away from the side to be characterized. For the measurement, a D65 beam is used and a commercially available multi-angle colorimeter is used to measure the brightness L (10° aperture angle). The measurement setup is explained in more detail below in connection with FIG. 26. In this context, full reference is made to the European standard EN ISO 11664-4.

In the facade element according to the invention, the first pane serves to color the facade element, whereas the second pane serves to mechanically support (reinforce) the facade element. In an advantageous embodiment of the facade element, the mechanically supporting second pane is thicker and thus mechanically stronger than the coloring first pane, so that both panes can be optimized in terms of their function. Alternatively, however, it is also possible for the coloring first pane to be thicker than the mechanically supporting second pane. This can be particularly advantageous if a further (mechanically supporting) pane with a relatively low pane thickness is sufficient for a desired mechanical stability of the facade element.

In an embodiment of the facade element according to the invention, the color-imparting first pane is arranged on the light-incident side of the intermediate layer, i.e., the first pane forms the front cover pane of the facade element. Alternatively, however, it is also possible for the mechanically supporting second pane to be arranged on the light-incident side of the intermediate layer, i.e., the second pane forms the front-sided cover pane of the facade element. In the latter case, the light passes through the mechanically supporting second pane until it hits the coloring first pane.

The color of the facade element results from the color selected by the at least one optical interference layer when illuminated with white light (e.g., sunlight), the selected color being combined with the background color of a two-dimensional structure (e.g. wall) to which the facade element is attached. The overall impression thus results from the selected color and the background color.

In principle, it is possible for the facade element to be used without a back element contributing to the color generation. In practice, the background color of the planar structure to which the facade element is attached should then be taken into account.

In order to achieve a color independent of the background, the facade element has at least one two-dimensional back (rear-sided) element on its back (i.e., rear) side. Preferably, the at least one planar back element is opaque or semi-transparent. The at least one two-dimensional back element is arranged at the rear side of the facade element, i.e. in the direction of the incidence of light behind the fixed composite of color-imparting first pane and mechanically supporting second pane.

The at least one back element contributes to the coloration of the facade element. For this purpose, the back element is, for example, achromatic, dark and matte. It is also possible that the back element is colored in order to give the facade element a certain (predetermined or predeterminable) color impression in combination with the at least one color-giving optical interference layer arranged on the first pane. If the back element is photovoltaically active and has CIGS thin-film solar cells, these contribute to the overall color. The CIGS thin-film solar cells typically have a bluish-black color.

As mentioned above, the first pane has a front surface facing the external environment and a back surface opposite to it. Similarly, the second pane has a front surface facing the external environment (light incidence side) and a back surface opposite the front surface. In the installed state of the facade element in the facade, the front surface of a respective pane faces the external environment.

The at least one planar back element has a contact surface which is firmly connected to the back surface of the back (rear-sided) pane (first or second pane), i.e., the back surface of that pane which is arranged on the side of the intermediate layer facing away from the incidence of light.

For example, the at least one planar back element covers at least 70%, at least 90%, or at least 99% of the back (rear-sided) surface of the back (rear-sided) pane. In particular, the planar back element covers the back surface of the back pane over its entire region (100%, i.e., complete coverage). However, it is also possible that the at least one planar back element covers less than 70%, in particular less than 50%, of the back surface of the back pane.

The two-dimensional back element of the facade element may have a photovoltaically active or passive design.

According to a preferred embodiment of the facade element according to the invention, the at least one two-dimensional back element is designed to be photovoltaically active, i.e., suitable and intended for generating energy from sunlight. The colored facade element can thus be used in an advantageous manner for photovoltaic energy generation.

Preferably, the at least one photovoltaically active back element is a carrier substrate (pane) with series-connected solar cells applied thereto, wherein the carrier substrate is preferably directly, i.e., without an intermediate pane, firmly connected (e.g., by lamination) to the back (rear-sided) pane (first or second pane) of the composite of first and second pane by a further intermediate layer. The back pane thus forms a further composite of two panes with the carrier substrate. Overall, this results in a composite pane structure in which three panes are firmly connected to each other by lamination (first pane, second pane, carrier substrate). The solar cells are well protected against external weathering by the composite of the color-providing first pane and the mechanically supporting second pane.

It can be advantageous if the planar back element is smaller than the front-sided pane, relative to the plane of the pane. The dimensions of the planar back element along each direction of the front-sided pane are thus smaller than the dimensions of the front-sided pane. By this measure, the planar back element, especially if it has solar cells, is particularly well protected against external influences.

The photovoltaically active back element is provided with solar cells electrically connected in series for photovoltaic energy generation. In principle, these can be any type of solar cells, in particular silicon-based solar cells on wafer basis (solar cells on carrier substrate in superstrate configuration) or thin-film solar cells connected in series in monolithically integrated form (solar cells on a carrier substrate in substrate configuration). Preferably, these are thin-film solar cells that are series-connected in monolithically integrated form.

By laminating with the back (rear-sided) pane of the composite of the first and second pane, a thin-film solar module with a composite pane structure is produced from the carrier substrate with applied solar cells and the back pane, the back pane being firmly connected both to the front pane and to the carrier substrate by a respective intermediate layer.

However, it is also possible that a complete solar module comprising two panes firmly connected to each other by an intermediate layer (e.g., carrier substrate with solar cells, in particular thin-film solar cells, and cover plate) is firmly connected to a single pane (first pane or second pane). As a result, a composite pane structure with three panes is also created here, which are firmly connected to each other by two intermediate layers. Advantageously, a prefabricated solar module can be used in this way. The prefabricated solar module can optionally have the mechanically supporting second pane or the coloring first pane, in which case the solar module is firmly bonded to the respective other pane (coloring first pane or mechanically supporting second pane). Each intermediate layer is preferably a thermoplastic or crosslinking polymer intermediate layer (e.g., PVB or EVA) that bonds the two panes together. Bonding is also possible using a transparent silicone or casting resin.

The photovoltaically active back element preferably has thin-film solar cells in a substrate configuration, in which the layered structure for producing the solar cells is deposited on a surface of the supporting substrate facing the light entrance side. Consistent with common usage, the term "thin-film solar cells" refers to a layer structure with a small thickness of, for example, a few micrometers, so that a supporting substrate is required for sufficient mechanical strength. The carrier substrate can, for example, consist of inorganic glass, steel or plastic and, depending on the respective layer thickness and the specific material properties, can be designed as a rigid plate or flexible film. Preferably, the carrier substrate consists of glass.

In the case of thin-film solar cells, the layer structure comprises, in a manner known per se, a back electrode layer, a front electrode layer, and a photovoltaically active absorber layer arranged between the back and front electrode layers. The front electrode layer is optically transparent, since light must be able to pass through to the layer structure. The optically transparent front electrode layer typically comprises or consists of a doped metal oxide (TCO=Transparent Conductive Oxide), for example n-type, in particular aluminum-doped, zinc oxide (AZO).

Preferably, the photovoltaically active absorber layer comprises or consists of a chalcopyrite semiconductor, which is advantageously a ternary compound semiconductor from the group of copper-indium/gallium-disulfide/diselenide (Cu(In,Ga)(S,Se)$_2$). In the above formula, indium and gallium may each be present alone or in combination. The same applies to sulfur and selenium, each of which may be present alone or in combination. CIS (copper-indium-diselenide/-disulfide) or CIGS (copper-indium-gallium-diselenide, copper-indium-gallium-disulfide, copper-indium-gallium-disulfoselenide) is particularly suitable as a material for the absorber layer. The absorber layer typically has a doping of a first conductivity type (charge carrier type) and the front electrode has a doping of the opposite conductivity type. As a rule, the absorber layer is p-type (p-doped), i.e. has an excess of defect electrons (holes), and the front electrode layer is n-type (n-doped), so that free electrons are present in excess. A buffer layer is typically arranged between the absorber layer and the front electrode layer. This applies in particular to absorber layers based on Cu(In,Ga)(S,Se)$_2$, wherein a buffer layer is generally required between a p-type Cu(In,Ga)(S,Se)$_2$ absorber layer and an n-type front electrode. According to current knowledge, the buffer layer enables electronic matching between the absorber and the front electrode. It also provides protection against sputter damage in a subsequent process step of front electrode deposition, for example by DC magnetron sputtering. The sequence of n-type front electrode layer, buffer layer and p-type absorber layer forms a p-n heterojunction, i.e. a junction between layers of opposite conductivity type. The photovoltaically active absorber layer can also be made of cadmium telluride (CdTe) or amorphous and/or microcrystalline silicon, for example.

In the layer structure, series-connected solar cells are formed by patterning zones. Thus, at least the back electrode layer is divided by first patterning lines (P1 lines) into completely separated sections, which form the back electrodes of the solar cells. Furthermore, at least the absorber layer is divided by second patterning lines (P2 lines) into sections completely separated from each other, which form the absorbers of the solar cells, and at least the front electrode layer is divided by third patterning lines (P3 lines) into sections completely separated from each other, which form the front electrodes of the solar cells. Adjacent solar cells are electrically connected to each other via electrically conductive material in the second patterning lines in series connection, wherein the front electrode of a solar cell is electrically connected to the back electrode of the adjacent solar cell and has direct contact with the latter typically, but not necessarily. Each patterning zone comprises a direct sequence of the three patterning lines P1-P2-P3, each in this order.

Thin film modules based on amorphous and/or microcrystalline silicon and based on CdTe are usually constructed in superstrate configuration. The thin-film solar cells are thus coated on the light-entry side glass. On the back side, there is usually a second glass for climate-stable encapsulation. In this case, the transparent carrier glass on the light-entry side can also assume the role of the mechanically supporting pane. Lamination with a coloring pane results in a colored laminated glass module according to the invention.

Consistent with common usage, the term "solar cell" in thin-film solar modules refers to a region of the layered structure that includes a front electrode, a photovoltaically active absorber, and a back electrode, and is bounded by two immediately adjacent patterning zones. Each solar cell has an optically active zone comprising, stacked one on top of the other, a back electrode, an absorber and a front electrode, and capable of photoelectric conversion of light into electric current.

According to an embodiment of the facade element according to the invention, a masking layer partially covering the at least one back element is arranged in the direction of light incidence, behind the last interference layer (see further below), which covers photovoltaically inactive regions of the back element (connections, busbars, junction boxes, etc.). Accordingly, only the optically active regions of the solar cells are visible from the external environment, which further improves the external appearance of the facade element.

The planar back element is firmly connected to the back pane. The planar back element may itself have a color, wherein the color of the back element influences the overall color of the facade element.

According to an embodiment of the facade element according to the invention, the planar back element is photovoltaically passive, i.e., not intended and suitable for energy generation by sunlight.

The photovoltaically passive back element is formed, for example, in the form of a coating, in particular an opaque coating, of the back surface of the back (rear-sided) pane (first or second pane). Similarly, the back element may be formed, for example, in the form of a film, in particular an opaque film, firmly bonded to the back surface of the back pane (first or second pane), or of a rigid body (no coating), in particular an opaque rigid body, for example in plate form. The rigid body can be a supporting or non-supporting body and, as a supporting body, can in particular be a supporting plate. The bonding of a film or body to the back (rear-sided) pane (first or second pane) can be performed by a transparent adhesive, in particular a transparent adhesive film.

In particular, the color of the photovoltaically passive planar back element may be selected to correspond to the opaque background of colored solar modules, i.e., the back element may have a color corresponding to the optically active solar cells. Preferably, the photovoltaically passive planar back element is achromatic, dark and matte. Then, the color impression and angle dependence of the facade element can be particularly well matched with the correspondingly manufactured colored modules based on thin-film modules. These properties can be described as follows:

an L value of maximum 50, preferably less than 45 or less than 40;
a chroma $c=(a^2+b^2)^{1/2}$ of maximum 5, preferably smaller 2 or more preferably smaller 1.5.

To avoid gloss, the following requirement can also be added:

a reflectance haze of at least 90%, where reflectance haze is the proportion of diffusely reflected light to the total reflected light.

Various embodiments of the color-imparting first pane of the facade element according to the invention are further described.

According to an embodiment (referred to as "type I" for ease of reference) of the facade element, the front surface of the coloring first pane has at least one structured region on which a coloring optical interference layer is arranged for reflecting light within a predetermined or predeterminable wavelength range. The optical interference layer is preferably arranged directly (i.e., without any further intermediate layer) on the front surface of the first pane.

In the above embodiment of type I, it may be advantageous if the back surface of the coloring first pane has no structured region and no optical interference layer. The back surface is then preferably smooth (within production inaccuracies).

In the above embodiment of type I, it may be further advantageous if the back surface of the coloring first pane has no structured region, wherein a further optical interference layer is arranged on the back surface of the coloring first pane for reflecting light within a predetermined wavelength range. The back surface is preferably smooth (within production inaccuracies). The two optical interference layers may be the same or different. In particular, the two optical interference layers can be designed to reflect light within the same wavelength range. However, it is also possible that the two optical interference layers are designed to reflect light within different or only partially overlapping wavelength ranges. The thicknesses and refractive indices of the two optical interference layers can be the same or different. This allows the color of the facade element to be defined even better. In addition, mixed colors can be generated.

In the above embodiment of type I, it may be further advantageous if the back (rear-sided) surface comprises at least one structured region on which an optical interference layer is arranged for reflecting light within a predetermined wavelength range. The structured region of the back surface and the structured region of the front surface may be the same or different from each other. The layer thicknesses and refractive indices of the two optical interference layers may be the same or different from each other. These measures can also be used to further define the color of the facade element. In addition, mixed colors can be generated.

In the embodiment of the facade element of type I, a color with high intensity and low angular dependence is already generated by reflection and interference when the light strikes the structured front surface of the first pane with interference layer, even outside the gloss angle. The additional interference layer and/or structuring on the back surface of the first pane can further enhance this effect.

According to another embodiment (referred to as "type II" for ease of reference) of the facade element, a color-providing optical interference layer is arranged on the back surface of the color-providing first pane for reflecting light within a predetermined or predeterminable wavelength range. The optical interference layer is preferably arranged directly (without any further intermediate layer) on the back (rear-sided) surface of the coloring first pane. In addition, the back surface and/or the front surface of the coloring first pane each has at least one structured region, with the proviso that either the front surface has at least one structured region or a further optical interference layer for reflecting light within a predetermined or predeterminable wavelength range is arranged on the front surface. The optical interference layer is preferably arranged directly (without any further intermediate layer) on the front surface of the coloring first pane. This means that no optical interference layer is arranged on the front surface if the front surface has at least one structured region.

The incident light must therefore pass through the first pane at least once and be reflected at the internal interference layer in order to achieve the desired colorfulness with the improved angular stability. Due to the internally and/or externally structured surface of the coloring first pane, light with a high intensity and low angular dependence is also reflected outside the gloss angle, since the internally located interference layer represents a boundary surface with a higher refractive index. With external structuring, the light is already refracted at the interface between the air and the pane and is diffusely scattered from a wide variety of angles onto the internal interference layer. In the case of internal structuring only, the diffuse scattering takes place at this inner interface, since according to the invention many surface segments with different angles of inclination are available. In addition, a good homogeneous color impression is achieved by the color-imparting optical interference layer. The interference layer thus acts as a filter with a narrow-band reflection and a broad-band transmission.

In the above embodiment of type II, it can be advantageous if an optical interference layer is arranged on the back (rear-sided) surface of the coloring first pane, wherein the back surface of the coloring first pane has no structured region and the front surface of the coloring first pane has at least one structured region, and wherein no further optical interference layer is arranged on the front surface of the coloring first pane. The back surface is preferably smooth (within production inaccuracies). There is no condition of roughness for the segments of the structured region of the front surface of the facade element. The structured front surface can also have a greater microscopic roughness. At this interface, only transmission, refraction and scattering take place, but no interference. In this embodiment of the facade element according to the invention, it can be advantageous if the front surface of the coloring first pane is coated with a (e.g., thin) anti-reflective layer whose optical refractive index is smaller than that of the coloring first pane. This can suppress an essentially white reflection of the coloring first pane (e.g., glass) and increase the saturation level of the colors. However, an additional layer on the front surface of the coloring first pane can also have the same refractive index as the coloring first pane. In this case, the layer serves only to protect the coloring first pane from moisture and other corrosive components of the air. Etched satinized glasses have been shown to be more sensitive to moist heat than planar or rolled glasses. In the case of etched soda-lime glass, the additional layer may be, for example, a thin sputtered $SiO_2$ layer.

In the above embodiment of type II, it may be further advantageous to have an optical interference layer disposed on the back (rear-sided) surface of the coloring first pane, wherein the back surface of the coloring first pane has at least one structured region and the front surface has at least one structured region, wherein no further optical interference layer is disposed on the front surface of the coloring first pane. The structured region of the back surface and the structured region of the front surface of the coloring first pane may be the same or different from each other. There is no roughness condition for the segments of the structured region of the front surface. The structured front surface may also have a greater microscopic roughness. At this interface, only transmission, refraction, and scattering occur, but no interference. For the segments of the structured region of the back surface, the above condition for roughness applies because an optical interference layer is placed on the structured region. When the front surface is structured and the interference layer is on the back surface, the angular stability arises from the fact that light entering through the structured front surface is refracted at the differently inclined segments, strikes the interference layer at different angles, and, after interference and reflection, passes the structured front surface a second time as it exits the color-providing first pane, again changing direction by refraction.

In the above embodiment of type II of the facade element, it may be further advantageous if an optical interference layer is arranged on the back surface of the coloring first pane, wherein the back surface of the coloring first pane has at least one structured region and the front surface of the coloring first pane has no structured region, wherein no further optical interference layer is arranged on the front surface of the coloring first pane. The front surface is preferably smooth (within production inaccuracies). For the segments of the structured region of the back surface, the above condition for roughness applies, since an optical interference layer is arranged on the structured region. In this embodiment of the facade element according to the invention, it can be advantageous if the front surface of the coloring first pane is coated with a (e.g., thin) anti-reflective layer whose refractive index is smaller than that of the coloring first pane. In this way, a substantially white reflection of a glass color-providing first pane can be suppressed and the degree of saturation of the colors increases.

In the above embodiment of type II, it may be further advantageous if the back surface of the coloring first pane has at least one structured region and the front surface has no structured region, wherein another optical interference layer is disposed on the front surface of the coloring first pane. The front surface is preferably smooth (within production inaccuracies). For the segments of the structured region of the back surface, the above-mentioned condition for roughness applies, since an optical interference layer is arranged on the structured region. The two optical interference layers may be the same or different. In particular, the two optical interference layers can be designed to reflect light within the same wavelength range. However, it is also possible that the two optical interference layers are designed to reflect light within different or only partially overlapping wavelength ranges. The interference layer on the smooth outer surface can also be a color-neutral anti-reflective layer to reduce the white component of the total reflected light. The color is produced by reflection on the structured inner side with the interference layer. However, the interference layer on the smooth outer side can also be a color-generating layer that enhances the color generated on the inner side or mixes another color component in a different wavelength range with it.

In the design of the facade element of type II, the incident light must therefore pass at least once through the coloring first pane and must be reflected at the interior interference layer in order to achieve the desired color with the improved angular stability after exiting the front surface of the coloring first pane.

In the facade element according to the invention, the structured first pane reflects light with a high intensity and low angular dependence even outside the gloss angle. Due to the at least one optical interference layer, which has a coloring effect, a very homogeneous color impression is produced.

In an advantageous embodiment of the facade element according to the invention, at least 80%, particularly preferably at least 90%, of a structured region of the front surface or the back surface (depending on which surface is structured) of the coloring first pane is composed of the segments inclined to the plane of the coloring first pane. By increasing the number of segments, the intensity of the light reflected from the structured region of the surface of the coloring first pane even outside the gloss angle and its angular stability can be further increased.

In an advantageous embodiment of the facade element according to the invention, the angles of inclination of the (surface) segments are between 0° and 45° to the plane of the first pane (glass plane). At least 50%, preferably 70%, of the inclined segments should have an angle of attack of less than 25°. The distribution of the angles of attack should have a frequency maximum in the angular range of 0°-35°, preferably 0°-25°, which lies in the range of 5°-25°, preferably between 10° and 20°. Furthermore, the proportion of non-inclined surfaces (angle of attack=0°) should be less than 5% of the total angle distribution.

In an advantageous embodiment of the facade element according to the invention, the aspect ratio of width (B) to height (H) of the structures (segments) is at least B:H>2:1 and B:H<50:1, preferably B:H>3:1 and B:H<10:1.

If there are relatively many facets with a small inclination angle of less than 10°, essentially only reflected intensity occurs (as with an unstructured surface) at an observation angle close to the gloss angle, which is not desirable according to the invention. According to the above conditions, a very high intensity of the reflected light can be achieved even outside the gloss angle while at the same time having a particularly low angular dependence of the intensity. The structures are preferably non-periodic and anisotropic. However, periodic structures and/or anisotropic structures can also be used for special optical effects. Periodic and anisotropic structures such as pyramids, tetragonal or hexagonal honeycomb structures, or hemispheres can be readily produced with rollers during glass drawing. They can be used to create attractive gloss and color effects. When the surface structures meet the above conditions, the facade elements again show a significantly reduced decrease in chromaticity for angles outside the gloss angles, but the angular dependencies are then anisotropic with respect to the orientation in the plane of the coloring first pane.

The at least one optical interference layer may comprise, and in particular consist of, one or more refractive layers. A refractive layer is made of the same material (having the same composition) and, in particular, has a homogeneous (same) refractive index across the thickness of the layer. If the optical interference layer contains several refractive layers, at least two refractive layers consist of a different material from each other and have a different refractive index. Advantageously, at least one refractive layer has a refractive index n of greater than 1.7, preferably greater than 2.0 and particularly preferably greater than 2.3. In principle, the greater the refractive index, the lower the angular dependence of the reflected light, so that the angular dependence of the color impression can be further reduced.

Advantageously, the optical interference layer contains at least one compound selected from $TiO_x$, $ZrO_x$, SiC and $Si_3N_4$, i.e., non-absorbing materials with a higher refractive index. If the optical interference layer has two, three or more layers, the optical interference layer preferably contains at least one compound selected from $MgF_2$, $Al_2O_3$, $SiO_2$ and silicon-oxynitride. These are non-absorbing compounds with a relatively low refractive index.

In the facade element according to the invention, a good color impression can already be achieved due to the combination of a structured surface with an optical interference layer that has only a small number of refractive layers (e.g., one to three refractive layers). The small number of refractive layers simplifies the manufacture of the facade element and reduces production costs.

Advantageously, at least one optical interference layer (in particular all optical interference layers) of the facade element contains (or consists of) exactly one refractive layer whose refractive index n is greater than 1.9, preferably greater than 2.3.

Advantageously, at least one optical interference layer (in particular all optical interference layers) of the facade element contains (or consists of) exactly two refractive layers, wherein a first refractive layer with a first refractive index n1 is present on the coloring first pane with a refractive index nd and a second refractive layer with a second refractive index n2 is present on the first refractive layer. For the amounts (absolute values) of the differences of the refractive indices, the following applies: $|n1-nd|>0.3$ and $|n2-n1|>0.3$ and at least one of the refractive indices n1 or n2 is greater than 1.9, preferably greater than 2.3.

Advantageously, at least one optical interference layer (in particular all optical interference layers) of the facade element contains (or consists of) exactly three refractive layers, wherein a first refractive layer with a first refractive index n1 is present on the coloring first pane with a refractive index nd, a second refractive layer with a second refractive index n2 is present on the first refractive layer, and a third refractive layer with a third refractive index n3 is present on the second refractive layer. For the amounts (absolute values) of the differences of the refractive indices, the following applies: $|n3-n2|>0.3$ and $|n2-n1|>0.3$ and $|n1-nd|>0.3$. Here, the values of the refractive indices behave alternately: either n1>n2 and n3>n2 applies or n1<n2 and n3<n2 applies. In addition, at least one of the refractive indices n1, n2 or n3 is greater than 1.9, preferably greater than 2.3.

Due to the optical interference layers with exactly one, exactly two or exactly three refractive layers, a homogeneous color impression of the facade element can be achieved with simplified manufacture and lower production costs of the facade element. Two or three layers can increase the color intensity, i.e., brightness and saturation, i.e., the reflection in a specific narrow wave range. Angular dependence is reduced by relatively high refractive indices. Interference layers made of layer stacks with more than three layers in combination with the color-imparting first pane structured according to the invention and the embodiments shown are also within the scope of the invention, but are more complex to manufacture. With a quadruple layer of refractive layers with alternating high and low refractive indices, for example, the bandwidth of the reflected light can be further reduced with improved transmission.

In the at least one structured region of the coloring first pane, reflection of incident light radiation occurs with relatively high intensity even outside the gloss angle. For this purpose, the structured region is preferably formed in such a way that a reflection haze of more than 50%, especially preferably more than 90%, is present. The reflectance haze can be determined by a commercially available haze meter. According to ASTM D1003, haze is the ratio of the diffuse component of the reflected light to the total reflection.

In the facade element according to the invention, at least one zone should be provided in which the segments have an average roughness of less than 15% of the layer thickness of the optical interference layer on the front surface, thus enabling constructive or destructive interference of the reflected light. Advantageously, this zone extends over the entire color-providing first pane. According to an embodiment, the structured region has at least one further zone, i.e. (partial) region, in which the segments each have such an average roughness that interference does not occur at the optical interference layer. For example, the segments there have an average roughness of 50% to 100% of the layer thickness of the interference layer. In these zones, the facade element does not exhibit any color generated by the optical interference layer.

According to an embodiment of the facade element according to the invention, the composite of first pane and second pane for forming an insulating pane is connected to at least one further pane via a spacer. The basic structure of insulating panes is known to those skilled in the art, so that it is not necessary to go into more detail here.

Furthermore, the invention extends to the use of the facade element according to the invention as an (integral) component of a building envelope (building wall) or a free-standing wall, for example a visual protection or noise protection wall. Particularly advantageously, the facade element according to the invention is used as a component of a curtain wall, post-and-beam facade or window facade.

The various embodiments of the invention can be realized individually or in any combination. In particular, the features mentioned above and to be explained below can be used not only in the combinations indicated, but also in other combinations or on their own, without leaving the scope of the present invention.

BRIEF DESCRIPTION OF THE DRAWINGS

The invention will be explained in more detail hereinafter, with reference to the accompanying drawings. They show in simplified, not to scale representation:

FIGS. 3-5 various embodiments of the facade element according to the invention with at least one back element in schematic cross-sectional views;

FIGS. 16-17 schematic cross-sectional views of further embodiments of the coloring first pane of the facade element according to the invention;

FIG. 18 a schematic representation of exemplary light paths upon reflection from the color-giving first pane;

Figure 1:
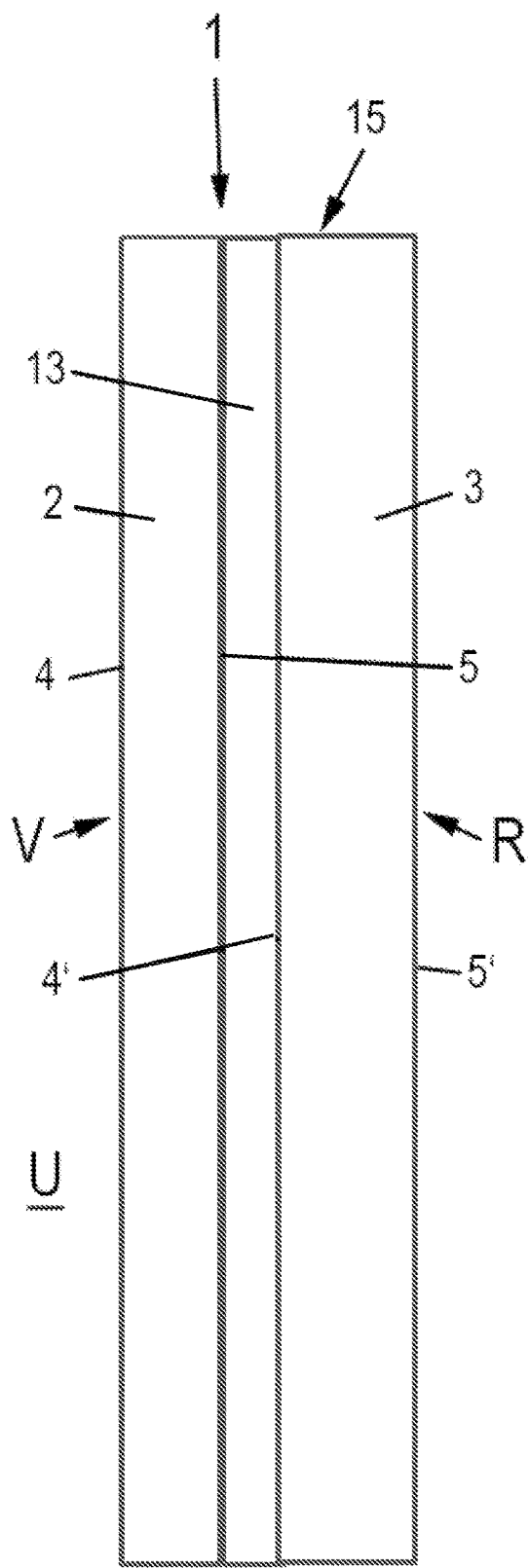
FIGS. 1-2 various embodiments of the facade element according to the invention without back element in schematic cross-sectional views.

LIST OF REFERENCE SIGNS 1 facade element
2 first pane
3 second pane
4, 4' front surface
5, 5' back surface
6 adhesive layer
7 contact region
8, 8' structured region
9, 9' optical interference layer
10, 10' segment
11 first zone
12 second zone
13, 13' intermediate layer
14 back element
15, 15' composite pane
16 carrier substrate
17 multi-angle colorimeter
18 solar cells
19 masking layer
20 solar module
21 connection cable
22 junction box
23 window
24 spacer
25 insulating glass pane
front V
back R
outer environment U

DETAILED DESCRIPTION OF THE DRAWINGS

Figure 2:
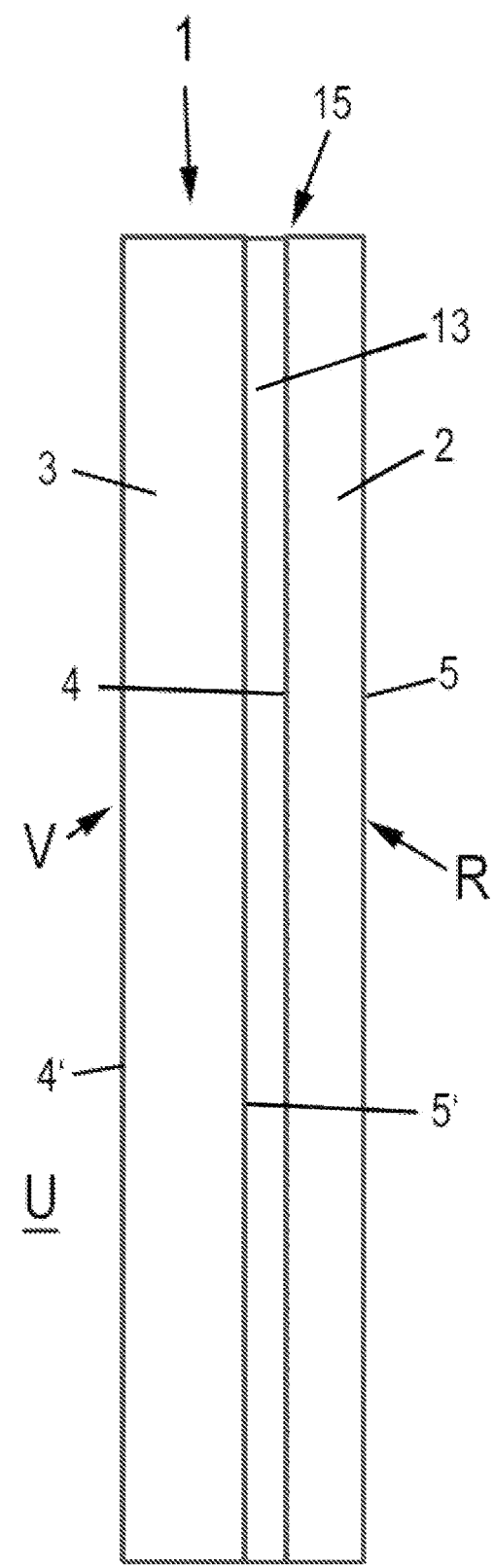

In FIGS. 1 and 2, the structure of a facade element designated in total with the reference numeral 1 according to an embodiment of the present invention is illustrated in a schematic manner by means of a cross-sectional view (section perpendicular to the surface of the facade element). The facade element 1 is intended for installation in a facade. For example, the facade element 1 can serve as a panel of a back-ventilated facade, be inserted into the infill of a post-beam supporting structure or be a window element in a window wall.

The facade element 1 comprises a transparent or semi-transparent, coloring first pane 2 and a mechanically supporting second pane 3, which are firmly connected to each other by an intermediate layer 13 (e.g., by lamination). The first pane 2 and the second pane are, for example, glass panes and are made of a glass that preferably has low absorption, such as soda-lime glass. Further, the first pane 2 is also referred to as a coloring glass element, and the second pane 3 is referred to as a mechanically supporting glass element.

The facade element 1 has a front side V, which is to be viewed from the external environment (side of light incidence), and a back side R, which in the installed state faces a generally planar structure (e.g., wall). For the purposes of the present invention, the surrounding region U of the front side V of the facade element 1 is considered to be the external environment (in FIGS. 1 and 2, in each case the surrounding region U which is located on the left of the facade element 1).

The coloring first pane 2 comprises a front surface 4 facing the external environment U and, opposite thereto, a back surface 5 facing away from the external environment U. Similarly, the second pane 3 comprises a front surface 4' facing the external environment U and, opposite thereto, a back surface 5' facing away from the external environment. For the purposes of the description of the invention, surfaces are referred to as "front surfaces" when they face the external environment U. Accordingly, surfaces are referred to as "back surfaces" when they are facing away from the external environment U. It would also be possible that the first pane 2 and/or the second pane 3 are each formed as a composite body and, in particular, consist of a transparent core embedded in another transparent material (e.g., sandwich-like) which has the same optical refractive index as the core. The front surface 4, 4' and back surface 5, 5' are then formed by this material. This is not shown in more detail in FIG. 1.

The first pane 2 is bonded to the second pane 3 by a bonding, for example by a laminating film, transparent silicone or casting resin to form a laminated glass element. The first pane 2 lies here, for example, on the outside, i.e., forms the front side V of the facade element 1. The second pane 3 lies on the inside, i.e., forms the back side R of the facade element 1.

The facade element 1, which comprises a composite pane 15 consisting of the first pane 2 and the second pane 3, assumes both a mechanical function (wind load) and a weather-protective function (rain etc.). Depending on the structural requirements, the thicknesses of the panes 2, 3 must be dimensioned accordingly. Depending on the structural requirements, the two panes 2, 3 are preferably made of processed glass, such as thermally toughened glass, so-called toughened safety glass (ESG), or heat-strengthened glass (TVG).

The first pane 2 is coated and textured for the purpose of coloring, which is explained in more detail below. The second pane 3 serves to mechanically support (i.e., reinforce) the coloring first pane 2 and contributes significantly to the mechanical stability of the facade element 1 so that it can withstand greater wind loads.

In the embodiment example shown in FIG. 1, the coloring first pane 2 is thinner than the mechanically supporting second pane 3. For example, the first pane has a pane thickness in the range of 2-4 mm. The second pane 3 is thicker than the first pane 2 and has, for example, a pane thickness of more than 4 mm.

In FIG. 2, a variant of FIG. 1 is shown, which differs from FIG. 1 only in that the mechanically supporting second pane 3 is the outermost pane of the facade element 1, i.e., forms the front side V of the facade element 1. Behind it is the coloring first pane 2.

In the facade element 1 of FIGS. 1 and 2, the color-giving first pane 2 is firmly connected to the second pane 3 (e.g., by lamination) and both together form a colored composite pane 15. The facade element 1 has, for example, no back side element. In particular, the color of the facade element 1 can be influenced by a colored background which is not part of the facade element 1.

Preferably, the facade element 1 has at its back side R at least one planar back side element, which is for example a photovoltaic passive back side element. Preferably, the planar back element is opaque. The photovoltaically passive back element is formed, for example, in the form of a coating, in particular an opaque coating, of the back surface 5', 5 of the back (rear-sided) pane (first pane 2 or second pane 3), for example over the entire surface. Similarly, the back element can be formed, for example, in the form of a film, in particular an opaque film, firmly connected to the back surface 5', 5 of the back pane (first pane 2 or second pane 3), or of a rigid body, in particular an opaque rigid body, for example in plate form. This is not shown in more detail in the figures.

Figure 5:
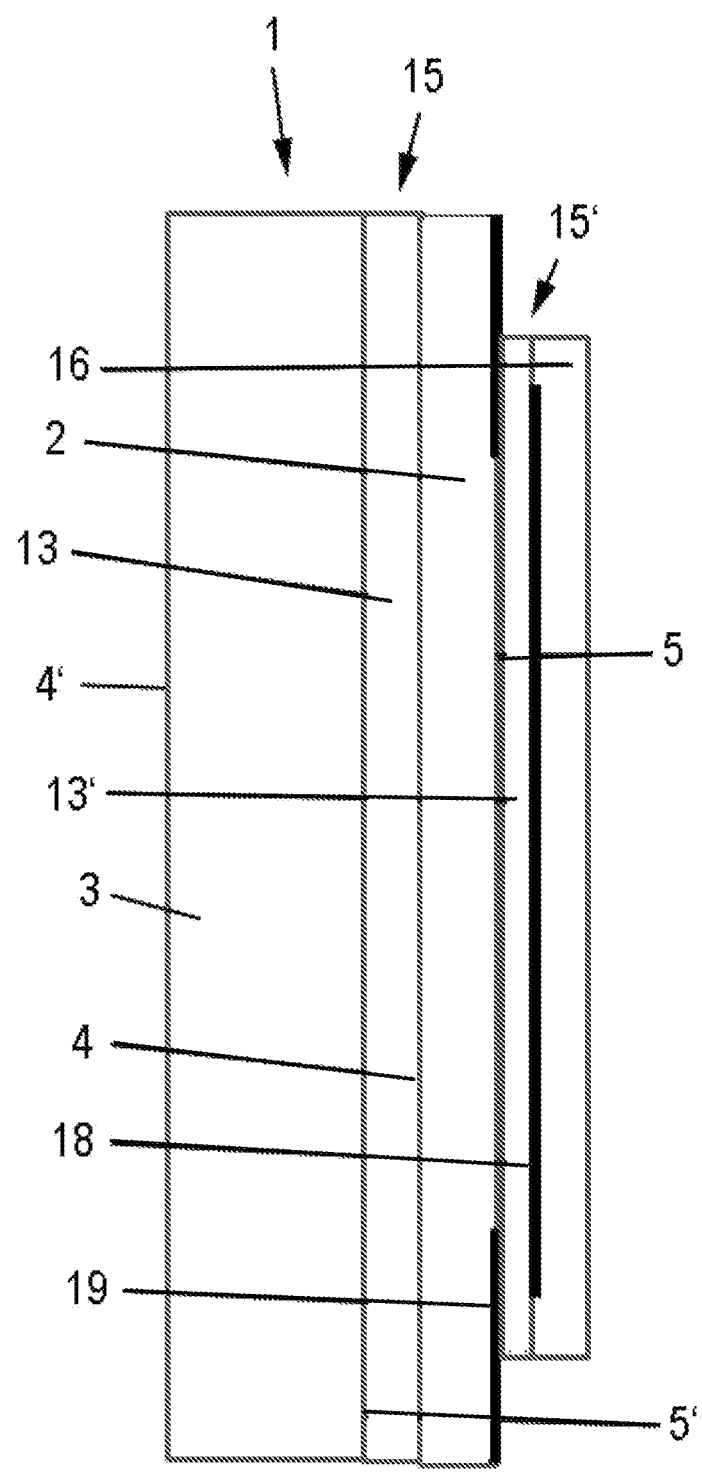

Particularly preferably, the colored facade element 1 has at least one planar back element which is photovoltaically active, i.e., is suitable and intended for generating energy from sunlight. The colored facade element 1 can thus be used in an advantageous manner for photovoltaic energy generation. Such embodiments are illustrated in FIGS. 3 to 5.

Let FIG. 3 be considered first. Shown therein is a facade element 1 as already explained in connection with FIG. 1. Reference is made to the corresponding explanations for FIG. 1. In addition, the facade element 1 has a photovoltaically active back element 14. The back element 14 comprises a carrier substrate 16 (glass pane) which is, for example, glassy here and on which a plurality of serially connected solar cells 18 are formed. The carrier substrate 16 is directly, i.e., without an intermediate pane, firmly connected (e.g., by lamination) to the back pane (here, e.g., second pane 3) of the composite pane 15 comprising first pane 2 and second pane 3 by a further intermediate layer 13'. The back pane 3 thus forms a further composite pane 15' with the carrier substrate 16. The overall result is a composite pane structure in which the two panes 2, 3 and the carrier substrate 16 are firmly bonded to one another by lamination. The further intermediate layer 13' for firmly bonding the back pane 3 and the carrier substrate 16 is preferably a thermoplastic or crosslinking polymer intermediate layer (e.g., PVB or EVA).

The solar cells 18 are well protected from external weathering by the composite pane 15 of first pane 2 and second pane 2. Preferably, the solar cells 18 are thin-film solar cells in which the photovoltaically active absorber layer consists of a chalcopyrite semiconductor, in particular a ternary compound semiconductor from the group of copper-indium/gallium-disulfide/diselenide $(Cu(In,Ga)(S,Se)_2)$.

FIG. 4 shows a variant of FIG. 3, which differs from the embodiment of FIG. 3 in that the second pane 3 is thinner than the coloring first pane 2. In addition, the second pane 3 is smaller than the first pane 2 and corresponds in its dimensions to the carrier substrate 16. The second pane 3 is designed here in the form of a cover plate for the carrier substrate 16 with solar cells 18. During the production of the facade element 1, a prefabricated solar module 20, which comprises the second pane 3 as a cover plate and the carrier substrate 16 with solar cells 18, can be laminated to the first pane 2. This can be advantageous in terms of process technology, since the solar module 20 can be prefabricated. The back element 14 then corresponds to the complete solar module 20. The size of the solar module 20 in the plane of the carrier substrate 16 is smaller than that of the first pane 2, so that the solar module 20 is well protected against external influences. It would also be possible to form the coloring first pane 2 as a cover plate of the solar module 20 (with correspondingly the same size as the carrier substrate 16), and then to firmly connect the solar module 20 to the mechanically supporting second pane 3 arranged at the front.

In the embodiments of FIGS. 3 and 4, at least one masking layer 19 is arranged behind the last interference layer (see below), i.e., behind the color-providing first pane 2. In FIGS. 3 and 4, the masking layer 19 is applied to the back surface 5 of the first pane 2 in each case. The masking layer 19 covers the back surface 5 only partially, covering the photovoltaically inactive regions. The photovoltaically active regions of the solar cells 18 are not covered. This improves the external appearance of the facade element 1.

In the embodiment of FIG. 3, the coloring glass element is thin. For example, the pane thickness is in the range of 2-4 mm. The mechanically supporting glass element is thicker. For example, the pane thickness is more than 4 mm. Behind the mechanically supporting glass element, one or more carrier substrates 16 with solar cells 18 (without front glass) or also glass panes with strings of silicon wafer solar cells or a back pane with strings of silicon wafer solar cells are laminated on. The non-active regions (contact bands, edge zones, intermediate regions, fitting pieces) are covered by the opaque masking layer 19. The opaque masking layer 19 is preferably located on the back surface 5 (i.e. side 2) of the coloring glass element or on the front surface 4' (i.e. side 3) or the back surface 5' (i.e. side 4) of the mechanically supporting glass element. The opaque masking layer 19 between the active regions also conceals cables, plugs or junction boxes. The laminated pane 15 of the color-providing glass element and the mechanically supporting glass element may be larger than the region of the one or more supporting substrates 16 if the edge regions are required for attachment with line support, point support or bonding. Various known lamination films such as PVB, EVA, cross-linking TPO, and others may be used to laminate the one or more support substrates 16. Standard sizes and relatively thin carrier substrate glass panes can be used. This is advantageous in the manufacture of the thin film solar modules.

In the embodiment of FIG. 4, the coloring glass element is on the outside. In this case it is rather thick (e.g., pane thickness in the range of 3-10 mm), since it takes over a substantial part of the mechanical stabilization. In this case, the mechanically supporting glass element is thinner and can also be smaller in width and/or height than the coloring glass element. Here, the mechanically supporting glass element is the front pane of the solar module 20. The introduction of the mechanically supporting glass element has advantages in terms of production technology. The solar module 20 can thus be manufactured as a series product at a module manufacturer complete with front glass and junction boxes and thus be further processed as an already sealed element at a manufacturer of glass facades. As in FIG. 3, the non-active regions (contact strips, edge zones, intermediate regions, fitting pieces) can be covered by the opaque masking layer 19. The opaque masking layer 19 is preferably located on the back surface 5 (i.e., side 4) of the color-giving glass element. The opaque masking layer 19 between the active regions also conceals cables, plugs or junction boxes. The composite pane 15 of the coloring glass element and the mechanically supporting glass element may be larger than the region of the one or more solar modules 20.

FIG. 5 shows a variant of the embodiment of FIG. 3. This differs from FIG. 3 in that the mechanically supporting glass element is the outermost glass pane of the facade element 1. Behind it is the coloring glass element. The coloring glass element is comparatively thin (pane thickness, e.g., in the range 2-4 mm). The coloring glass element is laminated onto the mechanically supporting glass element and both together form the colored laminated glass element or laminated pane 15'. Behind the coloring glass element, one or more carrier substrates 16 with solar cells 18, preferably thin film cells or also carrier substrates with strings of silicon wafer solar cells or a back pane with strings of silicon wafer solar cells are laminated on. The non-active regions (contact bands, edge zones, intermediate regions, fitting pieces) can be covered with at least one opaque masking layer 19. The at least one opaque masking layer 19 is preferably located on the inner surface 5 (side 4) of the color-giving glass element. The at least one opaque masking layer 19 between the active regions also conceals cables, plugs or junction boxes. If several carrier substrates 16 (circuits) are laminated on with (thin-film) solar cells 18, their backs (substrate glasses) are not connected.

Depending on the design of the supply chain, the solar module can be laminated directly with the coloring glass element in the solar module production facility and then delivered as a well-sealed and tested solar module to the facade element manufacturer.

Figure 7:
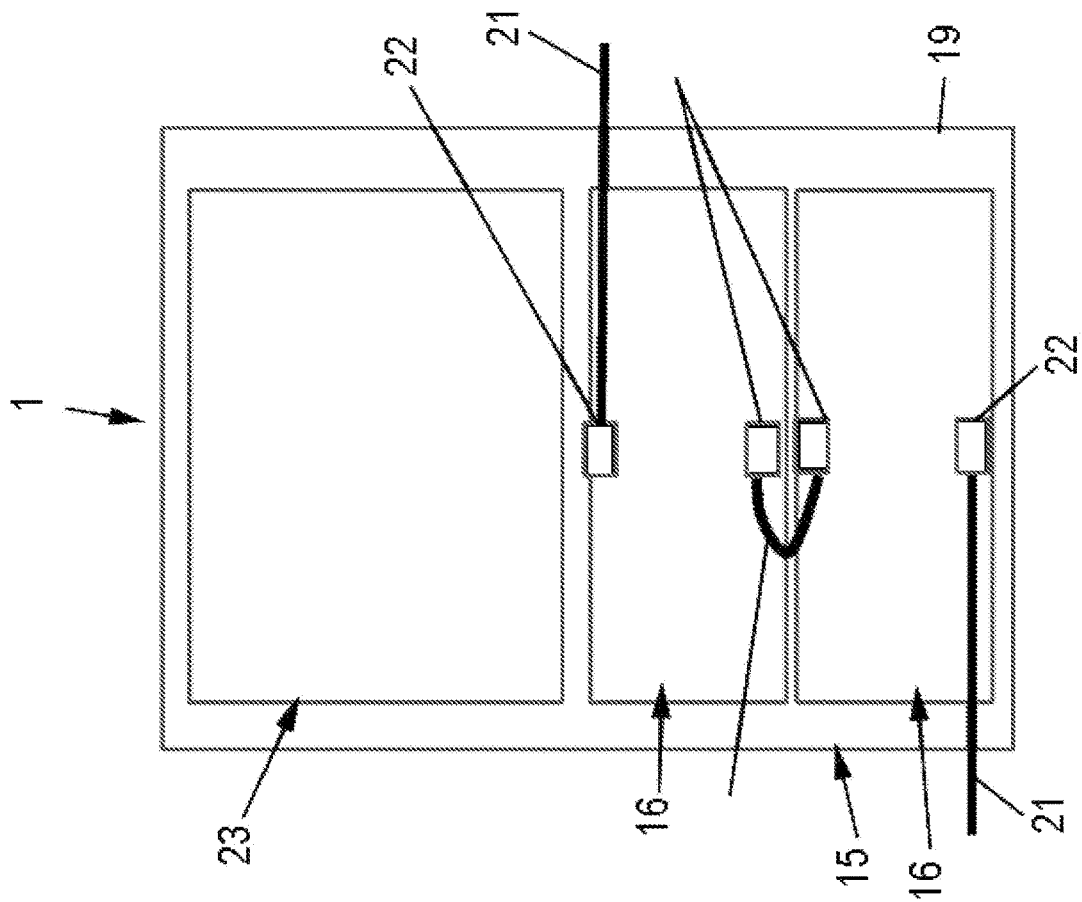
FIGS. 6-7 various embodiments of the facade element according to the invention with back side elements in plan view.
Figure 6:
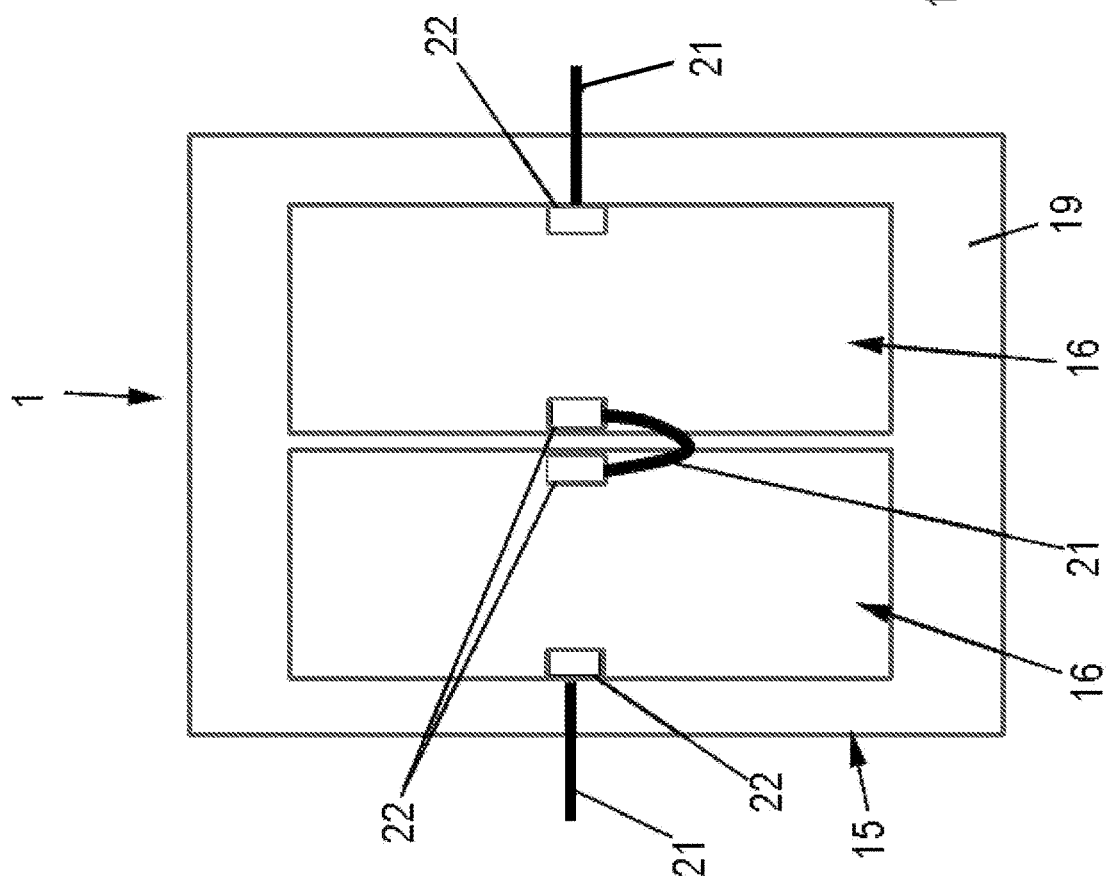

In FIGS. 6 and 7, various embodiments of the facade element 1 are shown, each in a top view of the back side R. The facade element 1 is based on the designs shown in FIG. 3 or 5. Accordingly, two carrier substrates 16 with solar cells 18 (circuits) are laminated onto the composite pane 15 consisting of the first pane 2 and the second pane 3. The solar cells 18 of the two carrier substrates 16 are connected to each other in series or in parallel by connection lines 21 and junction boxes 22. In addition, this provides external connections. In the embodiment of FIG. 7, a transparent window 23 is also provided in addition to the two carrier substrates 16 with solar cells 18 (circuits). The opaque masking layer 19 covers the photovoltaically inactive regions.

Figure 8:
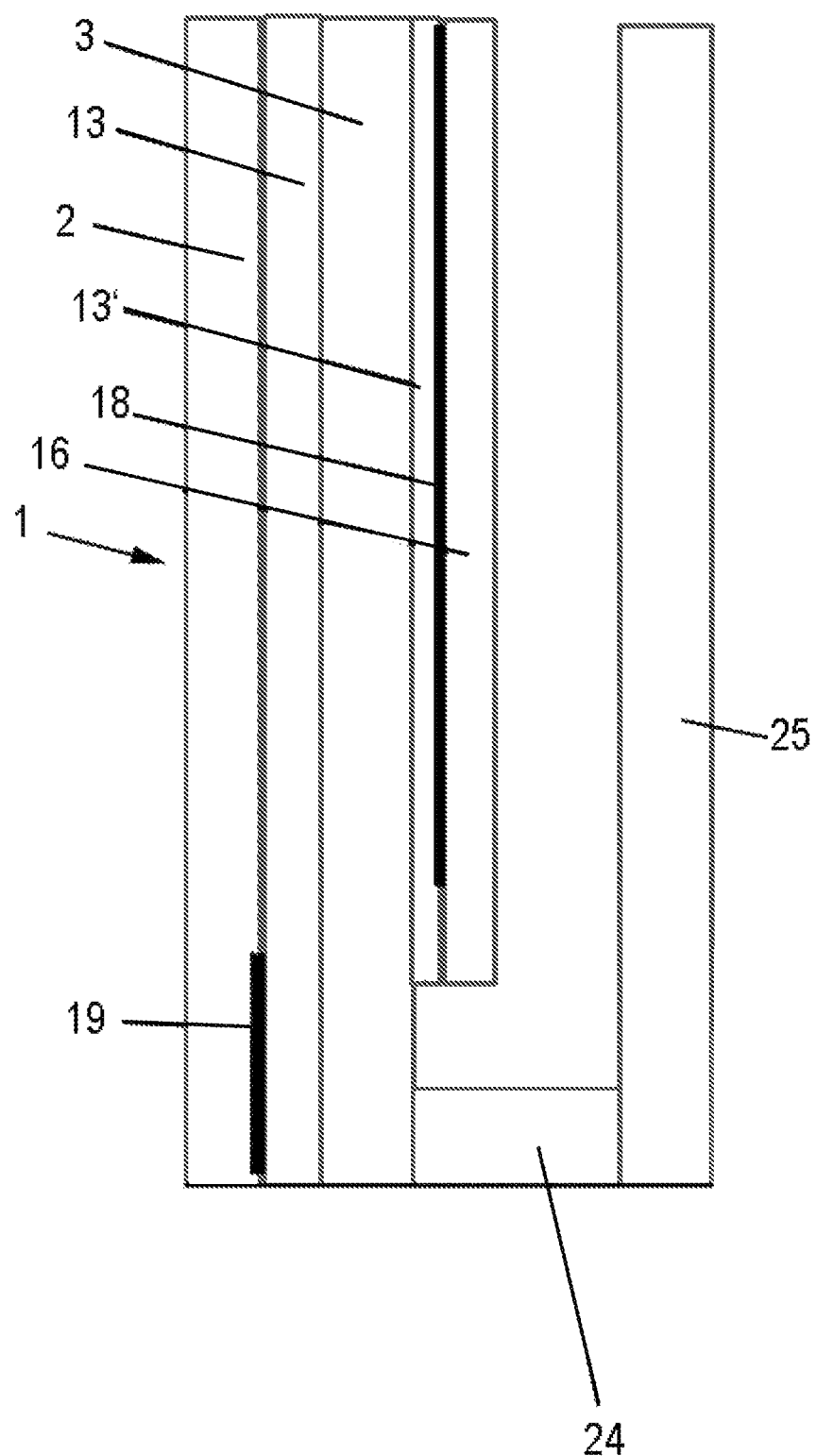
FIG. 8 a further embodiment of the facade element according to the invention in the form of an insulating pane.

FIG. 8 illustrates an embodiment of the facade element 1 as an insulating pane. Here, the composite pane 15, 15' consisting of first pane 2, second pane 3 and carrier substrate 16 with solar cells 18 is firmly connected to another insulating glass pane via a spacer 24.

Depending on the embodiment of the facade element 1, the front surface 4 and/or the back surface 5 of the coloring first pane 2 is structured (e.g., by etching, sandblasting or rolling during the drawing process) and has at least one optical interference layer, which is not shown in FIGS. 1 to 8. This will be explained in more detail below.

Figure 9:
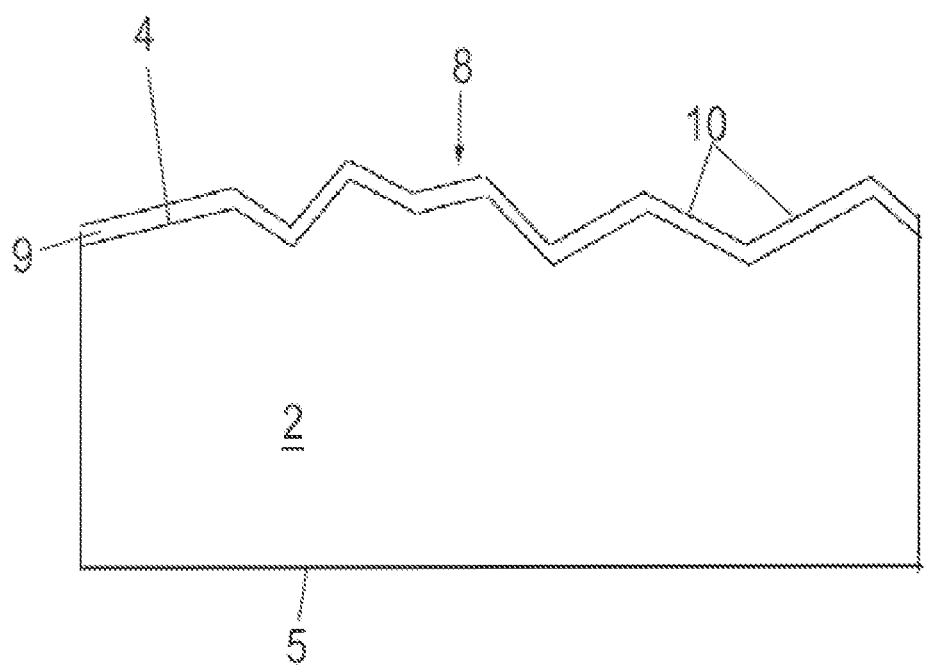
FIG. 9 a schematic cross-sectional view of the color-imparting first pane according to an embodiment of the facade element according to the invention.

FIG. 9 illustrates an embodiment of the facade element 1 according to the invention, wherein only the color-imparting first pane 2 is shown with an exemplary structuring. In particular, the facade element 1 can be designed as shown in FIGS. 1 to 8. Accordingly, the front surface 4 of the coloring first pane 2 is structured in a region 8 which, in the present example, extends over the entire front surface 4, i.e., front surface 4 and structured region 8 are identical. An optical interference layer 9 is arranged directly on the front surface 4. In the structured region 8, the front surface 4 is provided with a height profile which has mountains and valleys. Here, more than 50% of the front surface 4 consists of planar segments 10 whose planes are each inclined to the plane of the coloring first pane 2, i.e., have a non-zero angle to the plane of the coloring first pane 2. The segments 10 each have a segment area of at least 1 µm$^2$ and a mean roughness of less than 15% of the layer thickness d of the optical interference layer 9. A mean height sublayer between the highest points (mountains) and lowest points (valleys) of the front surface 4 is at least 2 µm and, for example, at most 20% of the thickness of the coloring first pane 2. With respect to the plane of the coloring first pane 2, at least 20% of the segments have an inclination angle in the range from greater than 0° to a maximum of 15°, at least 30% of the segments have an inclination angle in the range from greater than 15° to a maximum of 45°, and less than 30% of the segments 10 have an inclination angle greater than 45°. In the embodiment example of FIG. 9, all segments have an inclination angle of maximum 45°.

The optical interference layer 9 is thin and has a layer thickness in the range of, for example, 0.1 to a few (e.g., 2) micrometers. Furthermore, the optical interference layer 9 has a refractive index n of greater than 1.7, preferably greater than 2.0, and particularly preferably greater than 2.3, and the lowest possible absorption with respect to the incident light. The optical interference layer 9 can have a single-layer or multilayer design, i.e., consist of one or more refractive layers. Each refractive layer has a certain refractive index and consists of the same material. For example, the optical interference layer 9 consists of MgO, SiONx, $Si_3N_4$, $ZrO_2$, TiOx and/or SiC. The electrical conductivity of the individual refractive layers, in particular the optical interference layer 9, should be as low as possible.

Figure 10:
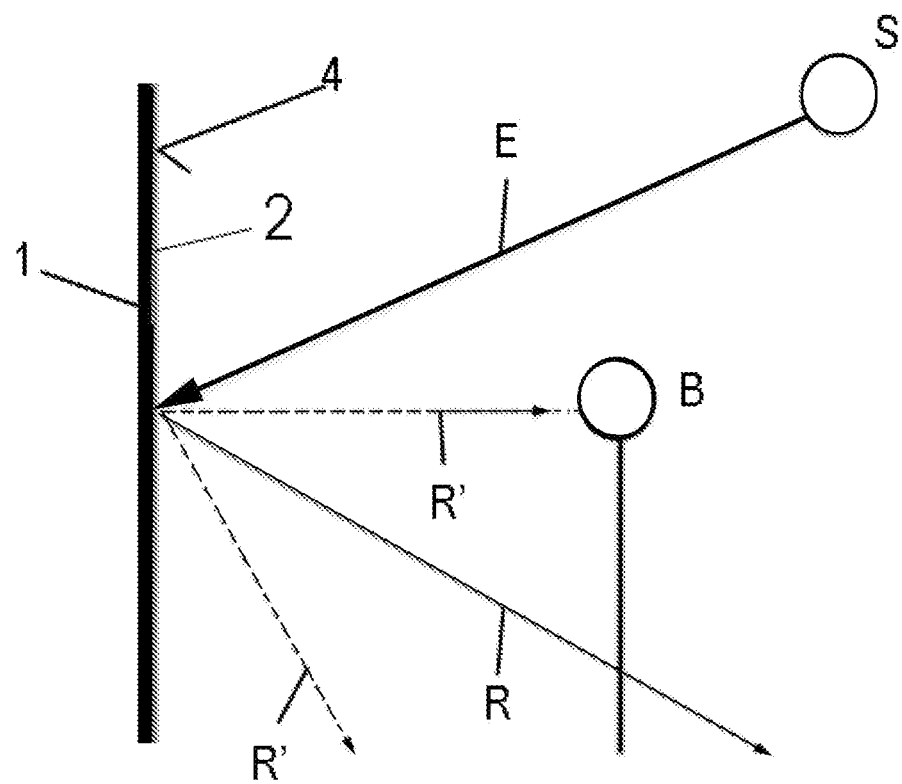
FIG. 10 a schematic representation of typical lighting conditions on a facade element according to the invention.

In the following, the mode of operation of the structuring of the front surface 4 of the color-imparting first pane 2 will be described in more detail. Let us first look at FIG. 10, in which typical light conditions for a facade element 1 are illustrated by way of example. According to this, light from the sun S strikes the coloring first pane 2 directly and is reflected at a gloss angle. The incident light beam E and the light beam R reflected at the gloss angle are shown. In addition to the reflected light beam R, the incident light is also diffusely scattered outside the gloss angle. Two diffusely scattered light beams R' are shown as examples. The color effect is caused by reflection, scattering and interference. If an observer B stands in front of the facade element 1 and looks perpendicularly at the color-giving first pane 2 in front of him, his eye only rarely meets the directly reflected light R (i.e., the observer is usually not standing at the gloss angle). This is illustrated in FIG. 10, where the observer B is outside the gloss angle and sees only the diffusely scattered light beam R'. For a smooth surface without a structured region 8, the intensity of the diffusely scattered light R' is relatively low and exhibits a strong angular dependence. Only when the diffusely scattered portion is sufficiently large there is a clear color with satisfactory intensity (brightness, L value).

Figure 11:
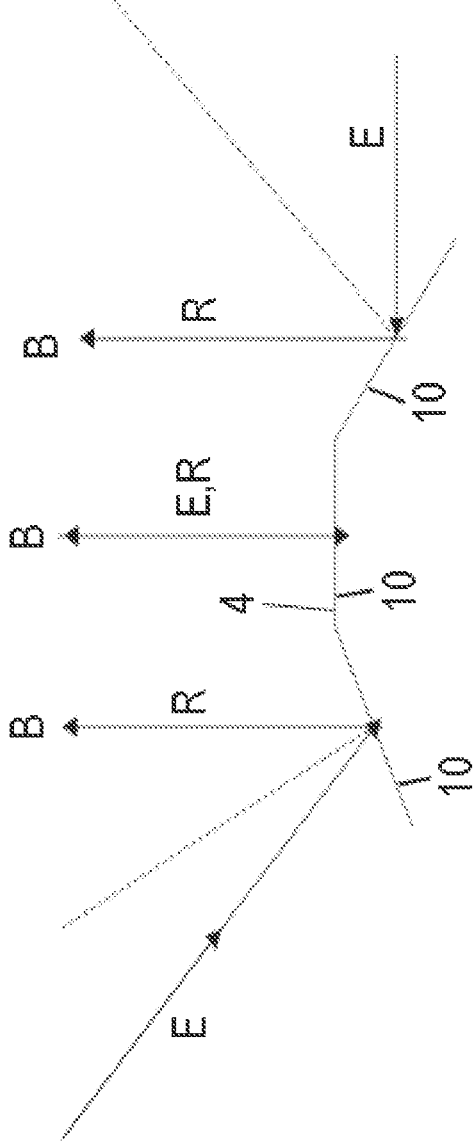
FIGS. 11-14 schematic representations of exemplary light paths upon reflection in the structured region of the color-giving first pane of FIG. 9.

The basic principle of the operation of the inclined segments 10 of the structured region 8 is illustrated in FIG. 11, wherein the various light paths are shown by way of example for an observer B looking perpendicularly at the glass surface or front surface 4 of the facade element 1. Shown are three segments 10 with different inclinations to the schematically illustrated plane GE of the color-giving first pane 2, as well as the light rays E incident on the segments 10, which are reflected by the segments 10 in each case at the local gloss angle to the observer B (reflected light rays R). The middle segment 10 is arranged parallel to the plane GE, with the incident light beam E striking the segment 10 perpendicularly and being reflected perpendicularly to the observer B (reflected beam R). For the middle segment 10, the gloss angle and local gloss angle are identical. For the two adjacent segments 10, the incident light rays E each have a non-zero angle to the surface normal to the plane GE and also strike the observer B at the local gloss angle. Due to the different inclinations of the segments 10, light from different directions is reflected in each case at the local gloss angle of the segments 10 to the observer B looking perpendicularly at the module surface. In the embodiment example of FIG. 11, the angle of incidence and angle of reflection amount to a maximum of 45°.

Figure 12:
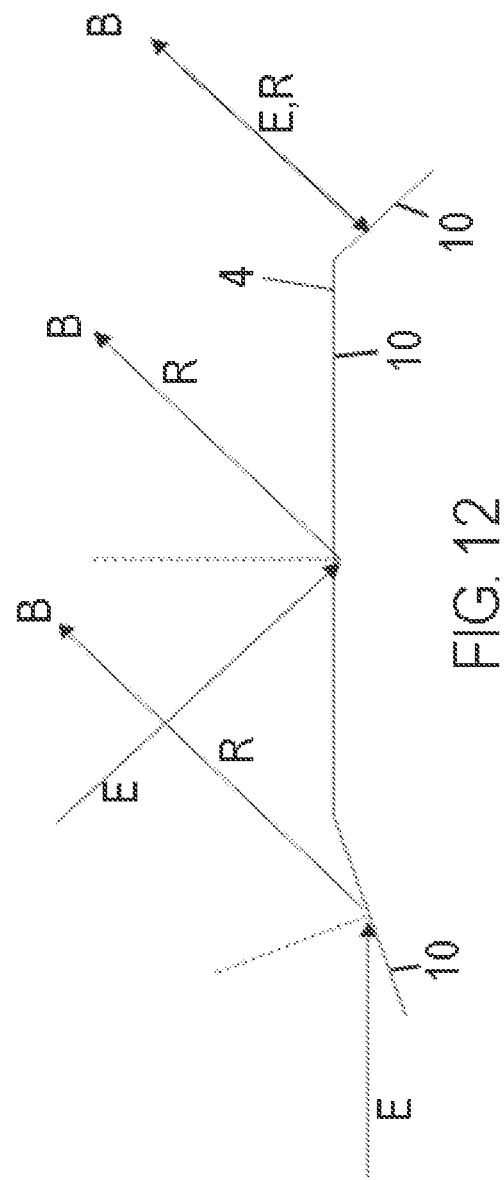

In FIG. 12, a situation is shown in which the observer B looks at the plane GE of the coloring first pane 2 at an angle of 45° to the surface normal. As in FIG. 11, three segments 10 with different inclinations to the plane GE of the coloring first pane 2 are shown as an example, as well as the light rays E respectively incident on the segments 10, which are reflected from the segments 10 at the local gloss angle to the observer B (reflected light rays R). Due to the different inclinations of the segments 10, light from different directions is reflected in each case at the local gloss angle to the observer B looking at the module surface. In the embodiment example of FIG. 12, the angle of incidence and angle of reflection amount to a maximum of 67.5°. In principle, the reflected light is blue-shifted at relatively large values of the gloss angle. This blue shift can be reduced by a higher refractive index of the optical interference layer. In the case of relatively steep surface inclinations, multiple reflection at neighboring facets can also occur.

Figure 13:
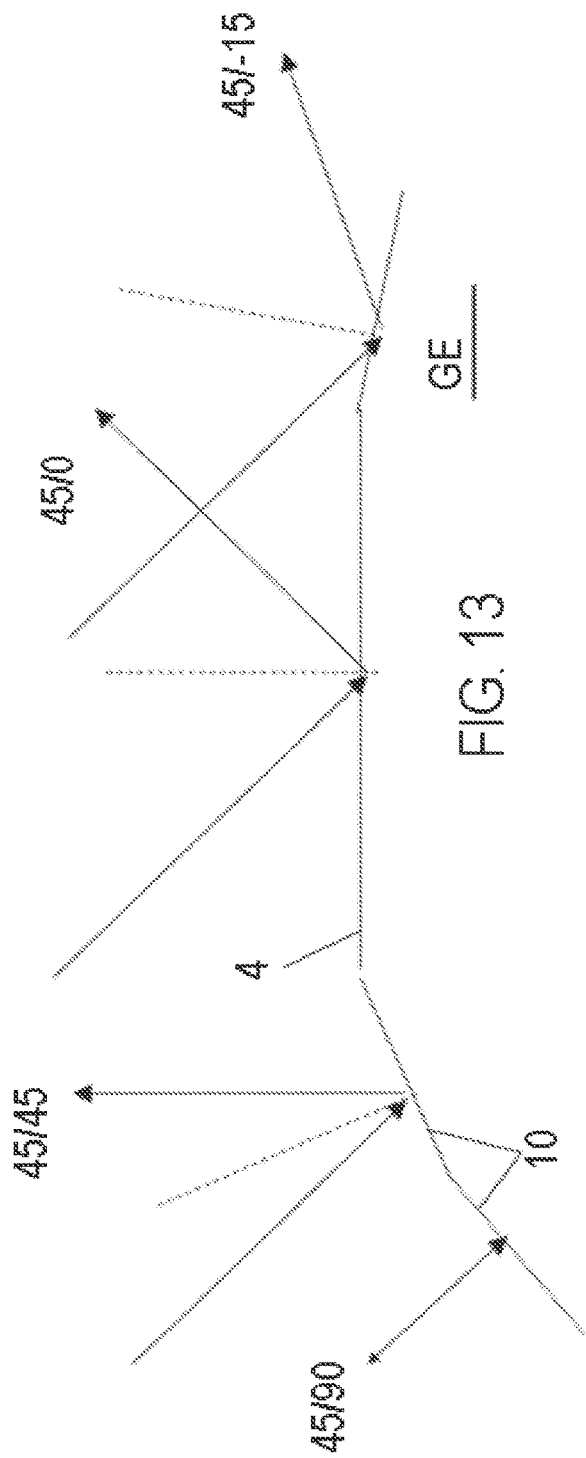

FIG. 13 shows a situation in which the light source and, accordingly, the incident light rays are always inclined at an angle of 45° to the plane GE of the color-giving first pane 2. The observer B observes the surface of the facade element 1 at different angles. The angular indications in FIG. 13 are to be understood as follows: angle of incidence (referred to plane GE of the coloring first pane 2)/angle of observation or reflection (deviation from the gloss angle referred to surface normal on plane GE). The degree sign "°" is not indicated. In FIG. 13, four segments 10 with different inclinations to the plane GE are shown as examples. Only in one segment 10, the plane of which is parallel to the plane of the coloring first pane 2, the observer B is located in the gloss angle with respect to the plane GE: 45/0. This means that the incident light beam has an angle of 45° to the plane GE, the reflected light beam has an angular deviation of zero from the gloss angle. For the other segments 10, the observer B is outside the gloss angle. For the two left segments 10 (45/90, 45/45), the observer looks at the surface of the facade element 1 at an angle of 90° and 45° to the gloss angle, respectively, with the light incident at an angle of 45° to the plane GE. In the case of the right segment 17 (45/−15), the observer is at an angle of −15° to the gloss angle. Due to the differently inclined segments 10 and the resulting reflection at the local gloss angle, light is reflected with sufficient intensity to the observer B even if the observer is not located at the gloss angle with respect to the plane GE of the color-giving first pane 10.

Figure 14:
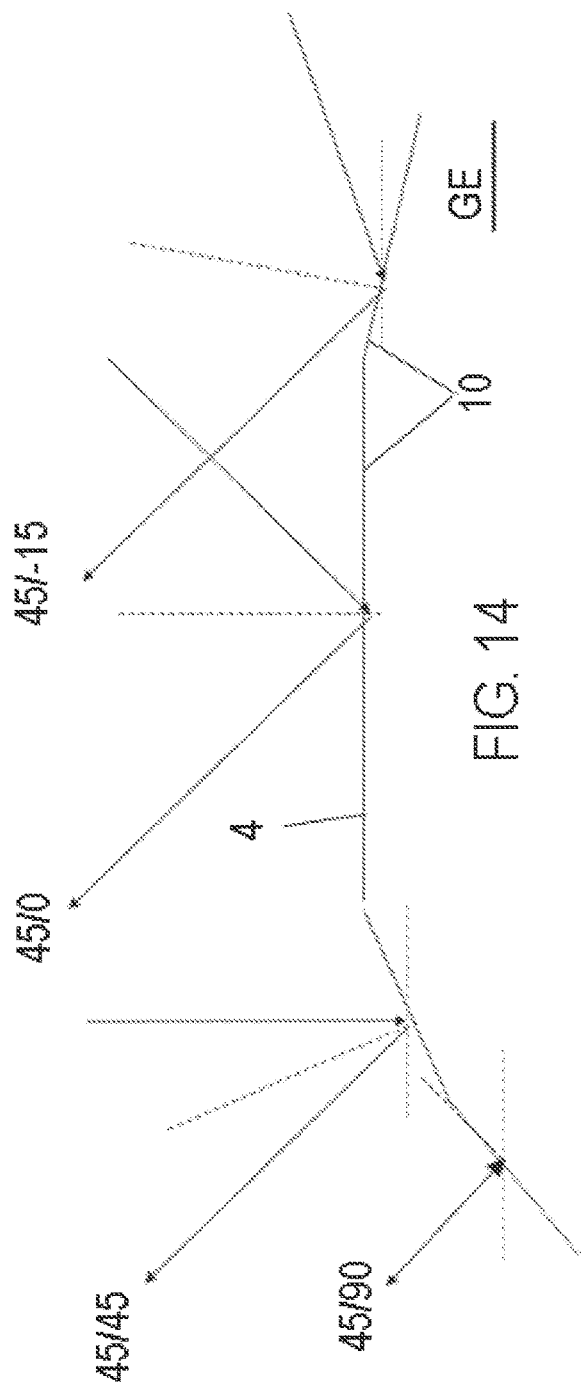

In FIG. 14, a situation is shown in which the observer B always observes the surface of the facade element 1 at an angle of 45° to the module surface or plane GE of the coloring first pane 2. In FIG. 14, four segments 10 with different inclinations to the plane GE are shown as an example. Only in one segment 10, whose plane is parallel to the plane GE, the observer B is located at the gloss angle: 45/0. In the other segments 10, the observer B is located outside the gloss angle. At the two left segments 10 (45/90, 45/45), the observer B is looking at the surface of the facade element 1 at an angle of 45°, where the light is incident at a deviation of 90° and 45°, respectively, relative to the gloss angle. In the case of the right segment 10 (45/−15), the light is incident at an angle of −15° relative to the gloss angle. Due to the differently inclined segments 10 and the resulting reflection at the local gloss angle, light is reflected with sufficient intensity to the observer B even if light is incident outside the gloss angle.

In the facade element 1 according to the invention, a homogeneous color impression in a predeterminable wavelength range can be achieved by structuring the front surface 4 of the color-imparting first pane 2 in combination with the color-imparting optical interference layer 9, whereby the color impression is much less dependent on the angle compared to a non-structured surface.

Figure 15:
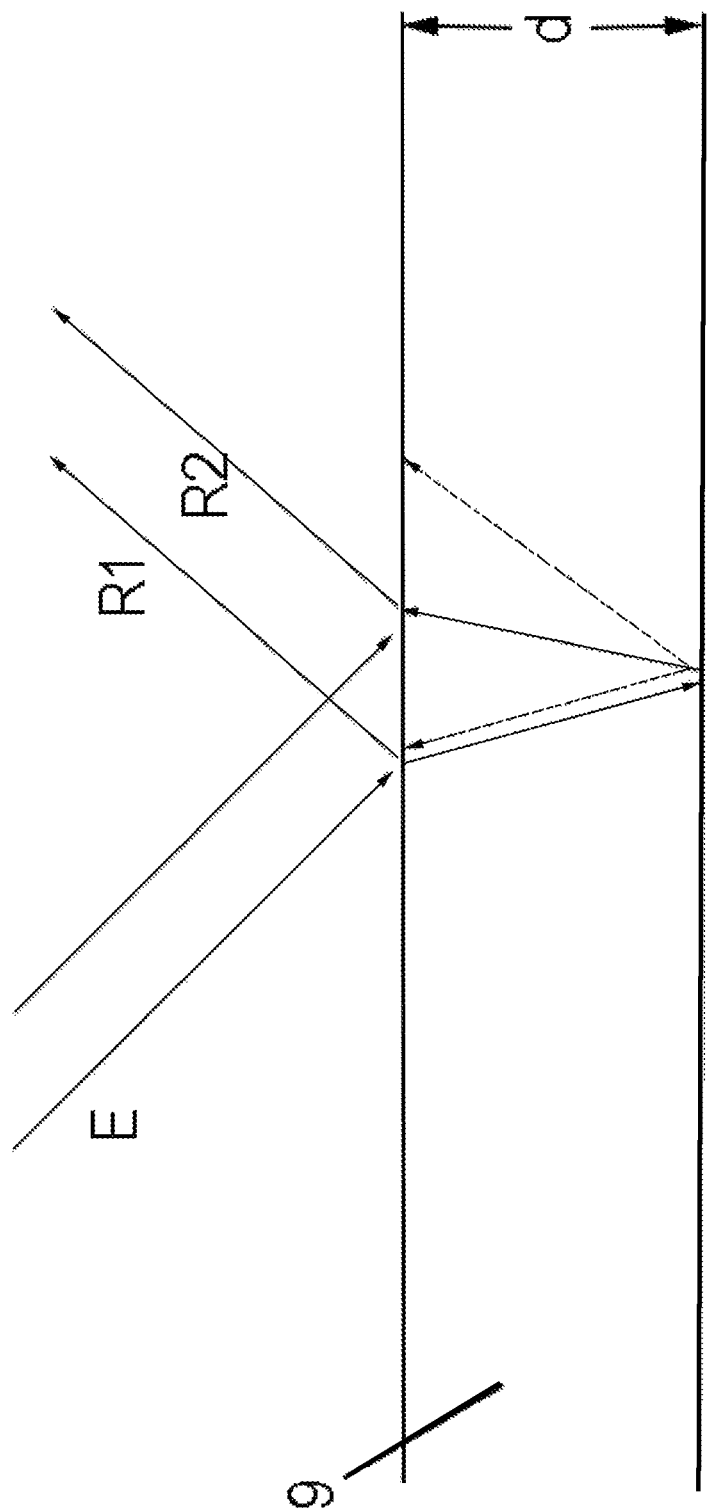
FIG. 15 a schematic representation of the interference of light rays in an optical interference layer.

FIG. 15 illustrates the reflection at the optical interference layer 9 with layer thickness d. The incident light beam E is reflected both at the atmosphere-interference layer interface (R1) and at the interference layer-pane interface (R2). If the path difference of the two light beams R1, R2 corresponds to a multiple of the wavelength of the incident light beam, constructive interference occurs; if the path difference is a multiple of half the wavelength, destructive interference occurs. When illuminated with white light, the optical interference layer 9 thus acts as a color filter, since constructive interference, depending on the refractive index n and layer thickness d, occurs only for light of suitable wavelength. Here a is the angle of the reflected rays R1, R2, to the surface normal. The light rays R' exemplify the reflected light outside the gloss angle, which may occur in the structured region 15 if the roughness of the interference layer-pane interface is too high. To satisfy the interference condition, it is necessary that the scattering centers are each smaller than the wavelength and thickness of the layer. Furthermore, R1 and R2 can only interfere if they are still on the same planar surface segment. Thus, the color-giving interference can be achieved by the minimum region of the segments claimed according to the invention and their maximum roughness.

If the front surface 4 of the color-giving first pane 2 is coated with an optical interference layer 9 consisting of an inorganic, chemically inert and hard layer such as with $Si_3N_4$, for example, a high scratch resistance, chemical resistance and dirt-repellent effect results for the facade element 1. The use of photocatalytic layers such as $TiO_2$ can also result in a self-cleaning effect. Climatic tests have also shown that interference layers of materials such as $Si_3N_4$ or $TiO_2$ also prevent corrosion of a glass first pane 2 by moist heat.

Figure 16:
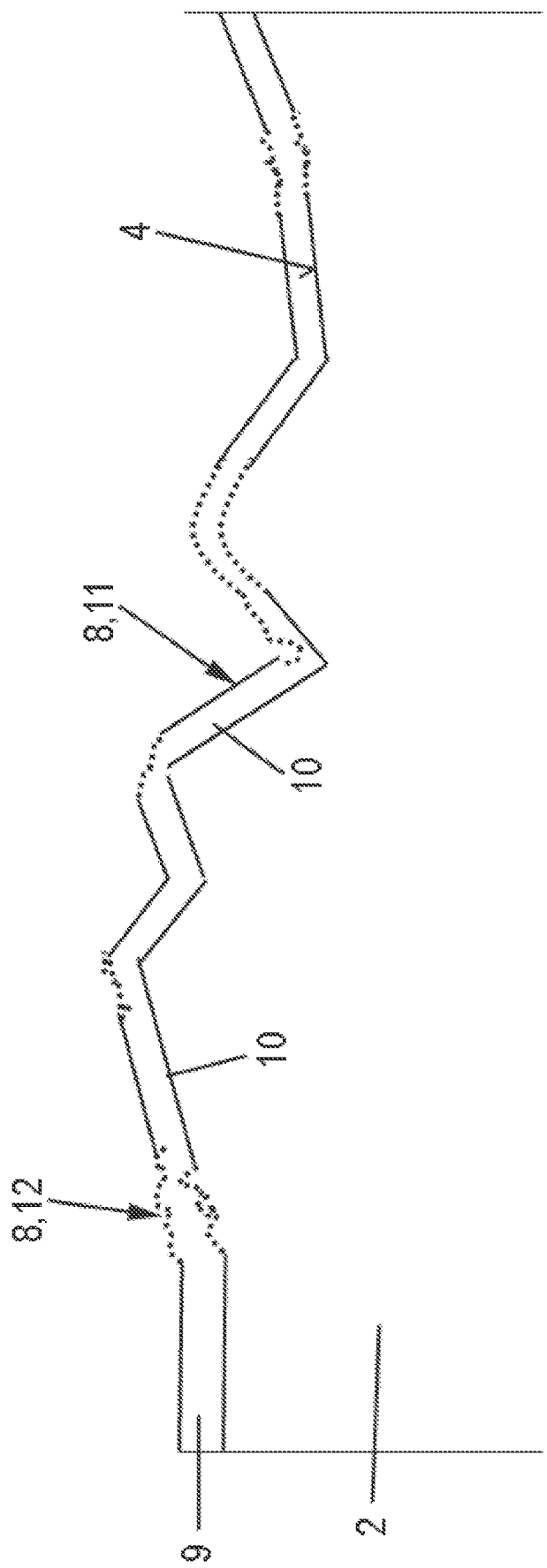

Reference is now made to FIG. 16, wherein a further embodiment of the facade element 1 according to the invention is illustrated, again showing only the coloring first pane 2. In order to avoid unnecessary repetition, only the differences from FIG. 9 are described and otherwise reference is made to the above explanations. In this embodiment, the structured region 8 of the front surface 4 has first zones 11 and second zones 12. Here, the first zones 11 are formed such that the segments 10 have an average roughness which is less than 15% of the layer thickness d of the optical interference layer 9 on the front surface 4. In the embodiment of FIG. 9, this applies to the entire structured region 8. In contrast, the average roughness in the second zones 12 is such that interference in the optical interference layer 9 is prevented. For example, the average roughness of the segments 10 in the second zones 12 is more than 50% of the layer thickness of the optical interference layer 9. The facade element 1 therefore has a homogeneous color in the first zones 11, which results from the color filter effect of the optical interference layer 9. In the second zones 12, the optical interference layer 9 has no color filter effect due to the lack of constructive interference, and thus there is essentially a surface corresponding to the facade element without optical interference layer 9. The facade element 1 can thus be provided with a homogeneous color in the pre-definable first zones 11 as desired. In FIG. 16, the second zones 12 are schematically illustrated by a greater roughness.

FIG. 17 illustrates a further embodiment of the facade element 1 according to the invention, in which only the color-imparting first pane 2 is shown. In order to avoid unnecessary repetition, only the differences from the embodiment of FIG. 9 are described and otherwise reference is made to the above explanations. Accordingly, the facade element 1 has a first optical interference layer 9 on the front surface 4 of the coloring first pane 2 on the structured region 8 and a second optical interference layer 9' on the back surface 5 of the coloring first pane 2. The back surface 5 of the coloring first pane 2 is not structured, i.e., does not have a structured region 8 analogous to the front surface 4. The back surface 5 is smooth within the limits of production inaccuracies. The second optical interference layer 9' has a layer thickness d' and an optical refractive index n' which may be the same as those of the first optical interference layer 9, but need not necessarily be the same. The second optical interference layer 9' further enhances the color effect. With reference to the embodiment of FIG. 9, there is a second reflection source with color filter effect, since the refractive index of the second optical interference layer 9' between the color-giving first pane 2 (e.g., glass) and the adhesive layer 6 is greater than that of the color-giving first pane 2 (e.g., glass) and the adhesive layer 6. Due to the refraction of light, the angle of incidence at the second reflection is smaller. Since the light passes through an optical interference layer three times in total, the light reaching the observer is more filtered. In particular, the coating thicknesses d, d' and the refractive indices n, n' of the two optical interference coatings 9, 9' can also be significantly different from each other. In the case of coatings with significantly different optical thicknesses $n*d$ or $n'*d'$, mixed colors can be generated, since the first optical interference layer 9 then generates a different reflection spectrum than the second interference layer 9' and the light reflected by the second interference layer 9' is superimposed when it passes the first interference layer 9 again. In this way, colored facade elements 1 with a variety of colors and high angular stability can be produced in a very simple and cost-effective manner.

In FIG. 18, the beam path of the incident light E and reflected light R1, R2 is illustrated in a highly simplified manner. In FIG. 18, the structuring of the coloring first pane 2 is not shown. Only a single beam path is shown, here in the gloss angle relative to the plane of the coloring first pane 2. It can be seen that the light that has passed through the first interference layer 9 is refracted in the coloring first pane 9 (e.g., glass), reflected a second time at the second interference layer 9' and thereby filtered by interference. When the light leaves the coloring first pane 2, it passes the interference layer 9, so that the interference layers are passed three times.

Figure 19:
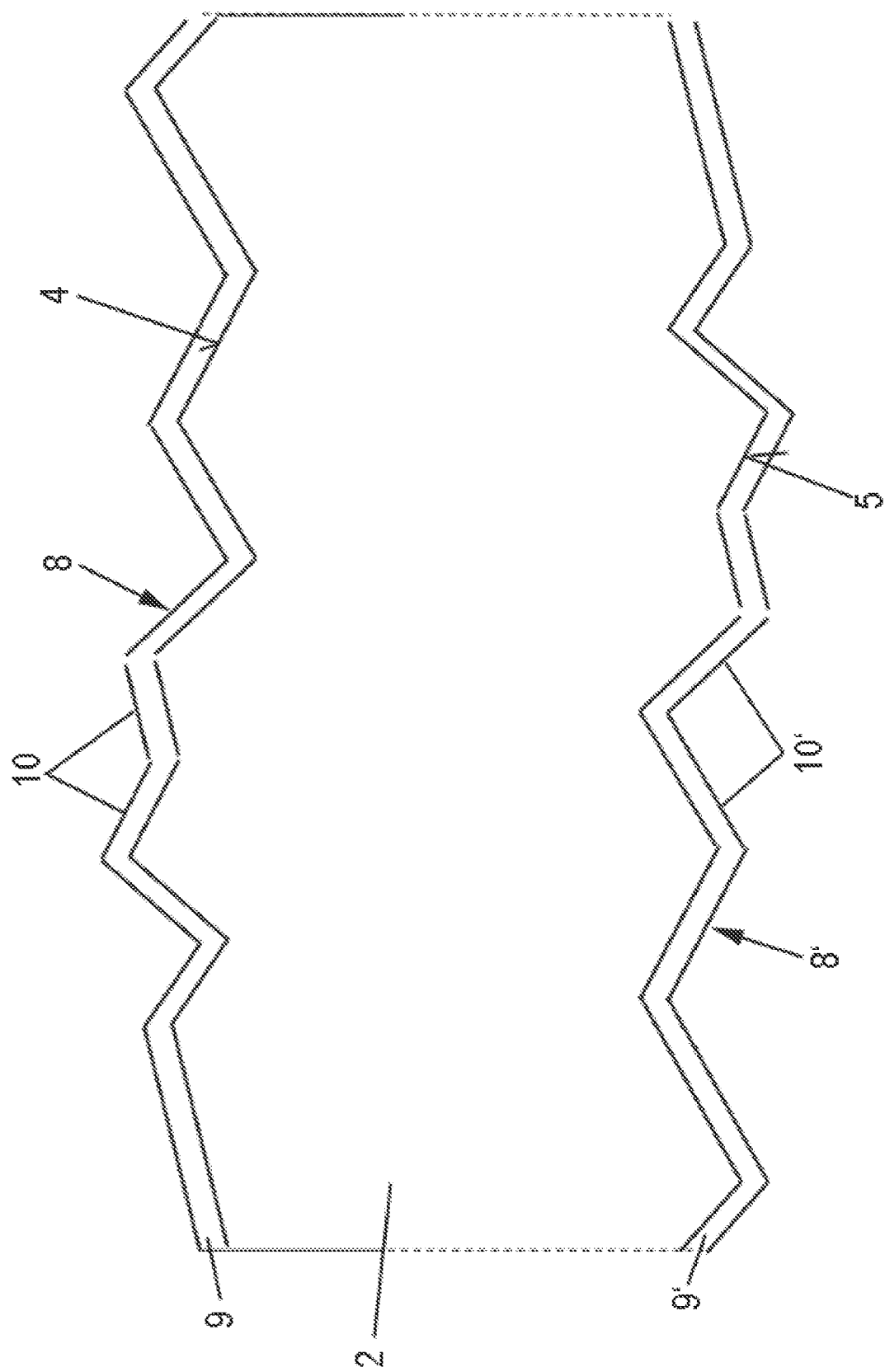
FIGS. 19-20 schematic cross-sectional views of further embodiments of the color-giving first pane of the facade element according to the invention.

FIG. 19 illustrates a further embodiment of the facade element 1 according to the invention, in which only the coloring first pane 2 is shown. To avoid unnecessary repetition, only the differences are described and otherwise reference is made to the above explanations. Accordingly, the facade element 1 has a first structured region 8 on the front surface 4 of the coloring first pane 2 and a second structured region 8' on the back surface 5 of the coloring first pane 2, wherein a first optical interference layer 9 is arranged on the first structured region 8 and a second optical interference layer 9' is arranged on the second structured region 8'. The two structured regions 8, 8' can be of the same or different design. Likewise, the two optical interference layers 9, 9' can be formed identically or differently, whereby in particular the layer thicknesses d, d' and the refractive indices n, n' of the two optical interference layers 9, 9' can be different from one another. If an equal optical thickness $n*d$ is selected for the two optical interference layers 9, 9', the color of the facade element 1 can be enhanced. When coating with significantly different optical thicknesses, mixed colors can be generated.

These embodiments have in common that already when the light hits the structured front surface with interference layer, a color with high intensity and low angular dependence is generated by reflection and interference, even outside the gloss angle. The additional interference layers and/or structuring on the back surface can further enhance this effect.

Figure 20:
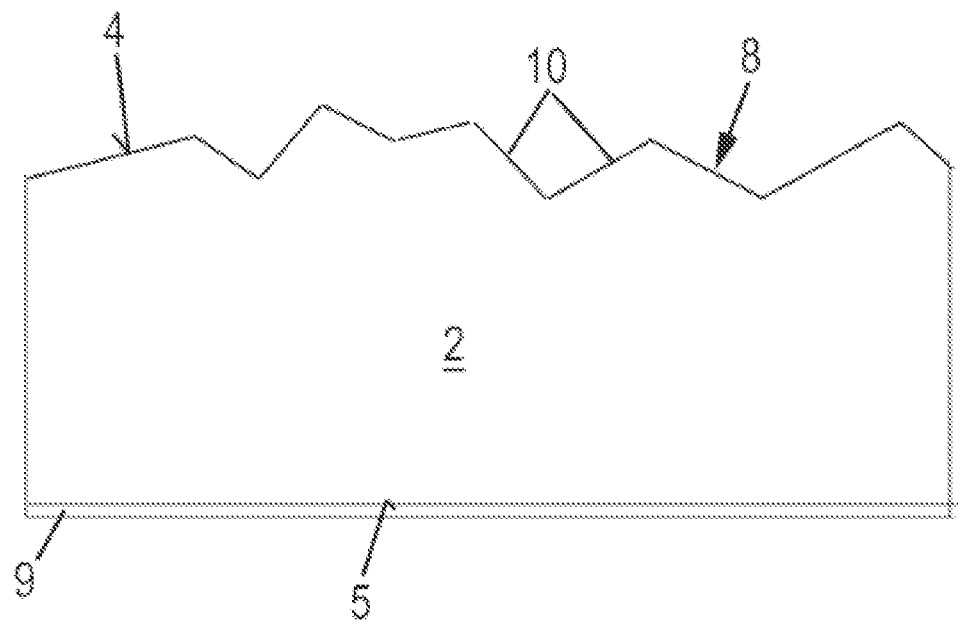

In FIG. 20, a further embodiment of the facade element 1 according to the invention is illustrated by means of an enlarged section of the color-providing first pane 2 of the facade element 1. In order to avoid unnecessary repetitions, only the differences are described and otherwise reference is made to the above explanations. Accordingly, the front surface 4 of the coloring first pane 2 is structured in a region 8 which, in the present example, extends over the complete front surface 4, i.e., front surface 4 and structured region 8 are identical. An optical interference layer 9 is arranged directly on the back surface 5 of the coloring first pane 2. The back surface 5 does not have any structuring and is smooth within the limits of production inaccuracies. There is no optical interference layer on the front surface 4. There is no roughness condition for the segments 10 of the structured region 8 of the front surface 4 of the facade element 1 of FIG. 20.

Figure 21:
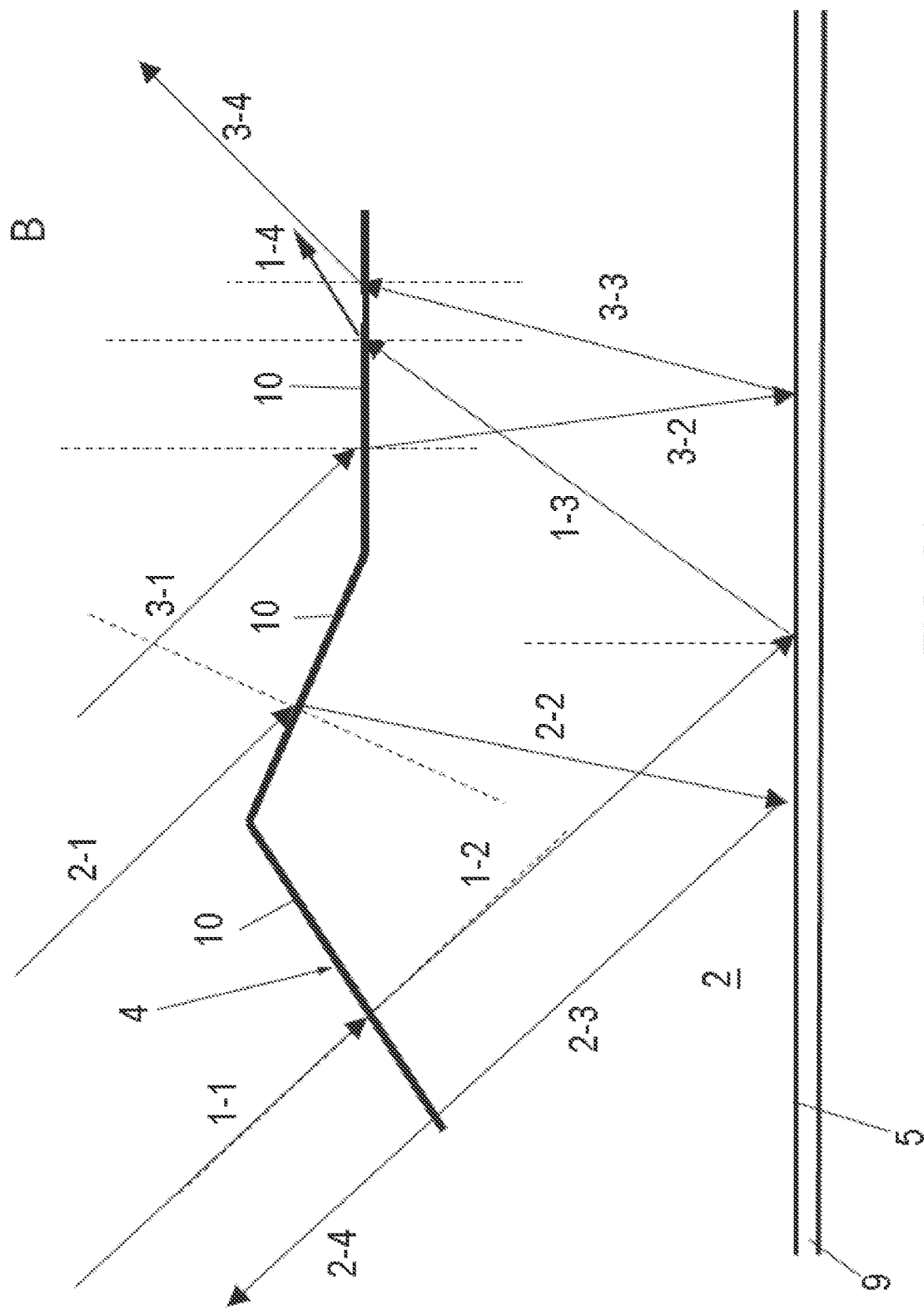
FIG. 21 a schematic representation of exemplary light paths upon reflection in the structured region of the facade element of FIG. 20.

With reference to FIG. 21, the function of the structured front surface 4 in combination with the internal interference layer 9 according to the embodiment of FIG. 20 is explained in more detail. Shown therein are exemplary different light paths for differently inclined segments 10 of the coloring first pane 2. Exemplary three segments 10 are shown, where the right segment 10 is parallel to the plane of the coloring first pane 2 and the other two segments 10 have a non-zero angle to the plane of the coloring first pane 2. The reflection of the light rays from the interference layer 9 is shown in simplified form. The reflection at the interference layer 9 has already been explained. In FIG. 21, the light paths for three light beams are shown, each of which strikes the differently inclined segments 10 of the front surface 4 of the coloring first pane 2 at the same angle to the normal to the plane of the coloring first pane 2. The respective normal to the segments 10 is drawn in dashed lines. Due to the differently inclined segments 10, the light rays are reflected in different ways. A first light beam 1-1 impinges on a segment 10, crosses the coloring first pane 2 as a refracted light beam 1-2, is reflected by the interference layer 9 (at the gloss angle) as a light beam 1-3, and emerges from the coloring first pane 2 toward the outer environment as a refracted light beam 1-4. The light beam 1-4 ultimately reflected from the coloring first pane 2 has a different angle to the normal to the plane of the coloring first pane 2 than the incident light beam 1-1, so that there is no reflection at the gloss angle but scattering. In a corresponding manner, a second light beam 2-1 impinges on another segment 10, traverses the coloring first pane 2 as a refracted light beam 2-2, is reflected by the interference layer 9 as a light beam 2-3, and emerges from the coloring first pane 2 toward the external environment as a refracted light beam 2-4. The reflected light beam 2-4 emerges from the coloring first pane 2 approximately opposite to the direction of incidence of the light beam 2-1, which is also a scattering process and not a reflection at the gloss angle. A third light beam 3-1 impinges on another segment 10, crosses the coloring first pane 2 as a refracted light beam 3-2, is reflected by the interference layer 9 as a light beam 3-3, and emerges from the coloring first pane 2 toward the outer environment as a refracted light beam 3-4. This segment 10 is parallel to the plane of the coloring first pane 2, so that the light beam 2-4 is reflected at the gloss angle. It is essential here that by those segments 10 which are inclined to the plane of the coloring first pane 2, due to the refraction at the respective segment 10 and subsequent reflection at the interface with interference layer 9 and further refraction at the structured surface, altogether a strong reflection also occurs outside the gloss angle (related to the plane of the coloring first pane 2), so that in combination with the interference layer 9 a homogeneous color effect of the reflected light is achieved.

FIG. 21 shows an example of the position of a viewer B who is located outside the gloss angle. Due to the relatively strongly (diffusely) scattering color-providing first pane 2 with external structuring and internal interference layer, suitable light paths are usually found for different viewing angles outside the gloss angle, which have passed through the interference layer. This results in a color impression that is much less direction-dependent than in conventional modules without structured region 8.

Figure 22:
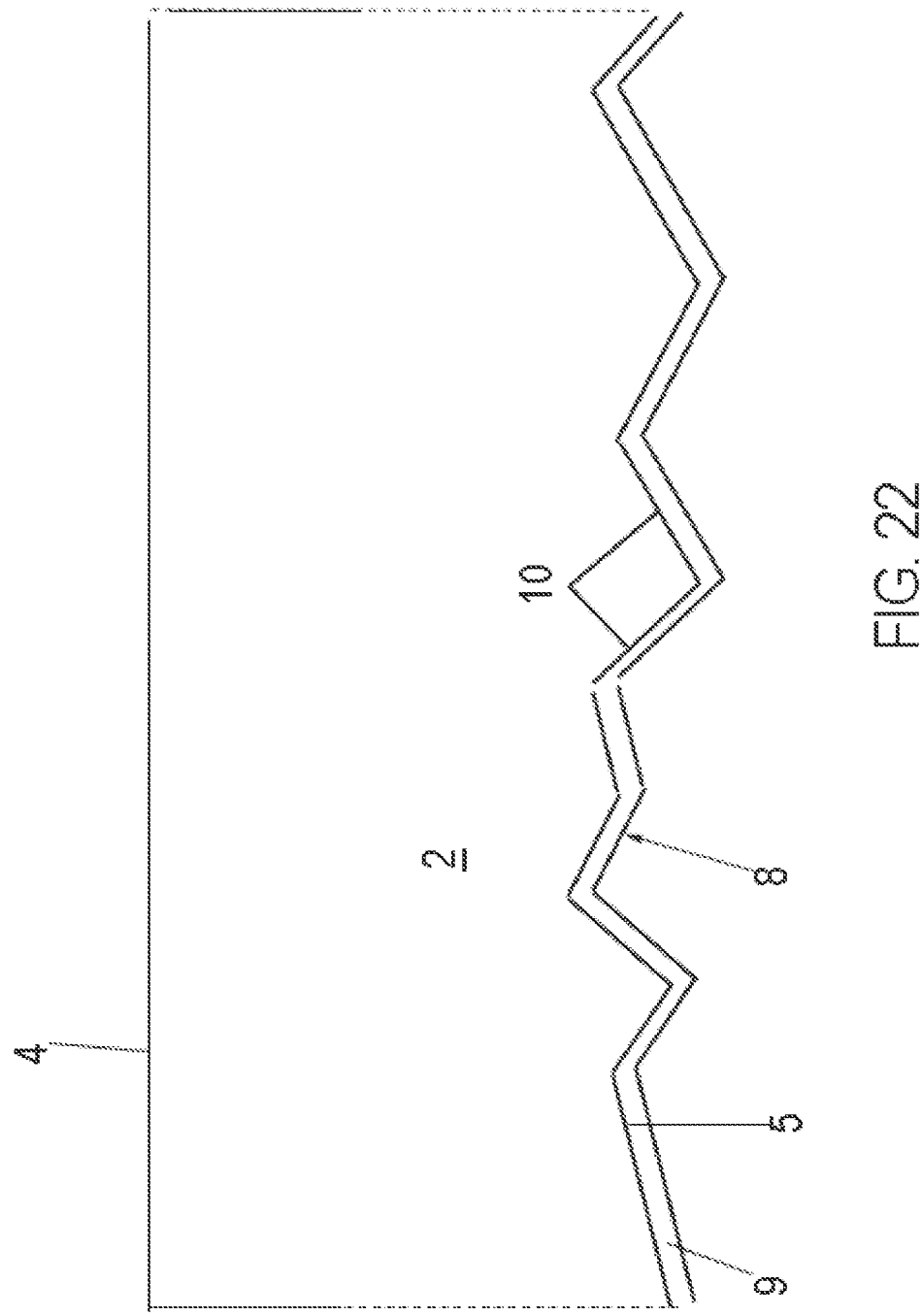
FIG. 22 a further embodiment of the color-imparting first pane of the facade element according to the invention in a schematic cross-sectional view.

Reference is now made to FIG. 22, in which a further embodiment of the facade element 1 according to the invention is illustrated, with only the color-imparting first pane 2 being shown. In order to avoid unnecessary repetitions, only the differences are described and otherwise reference is made to the above explanations. Accordingly, the facade element 1 has a structured region 8 on the back surface 5 of the coloring first pane 2, wherein an optical interference layer 9 is arranged on the structured region 8. The optical interference layer 9 is thin and follows the surface of the structured region 8. The structured region 8 and the optical interference layer 9 may each be formed analogously to the previous embodiments. The front surface 4 of the coloring first pane 2 does not have a structured region 8 and is smooth within production inaccuracies. Furthermore, no optical interference layer is arranged on the front surface 4. In contrast to the segments 10 of the structured region 8 of the front surface 4, the structured region 8 of the back surface 5 has the optical interference layer 9, so that the segments 10 have to satisfy the condition that the segments 10 of the structured region 8 of the back surface 5 are each planar, have a segment area of at least 1 $\mu m^2$ and have an average roughness of less than 15% of a layer thickness of the optical interference layer 9 on the back surface 5.

Figure 23:
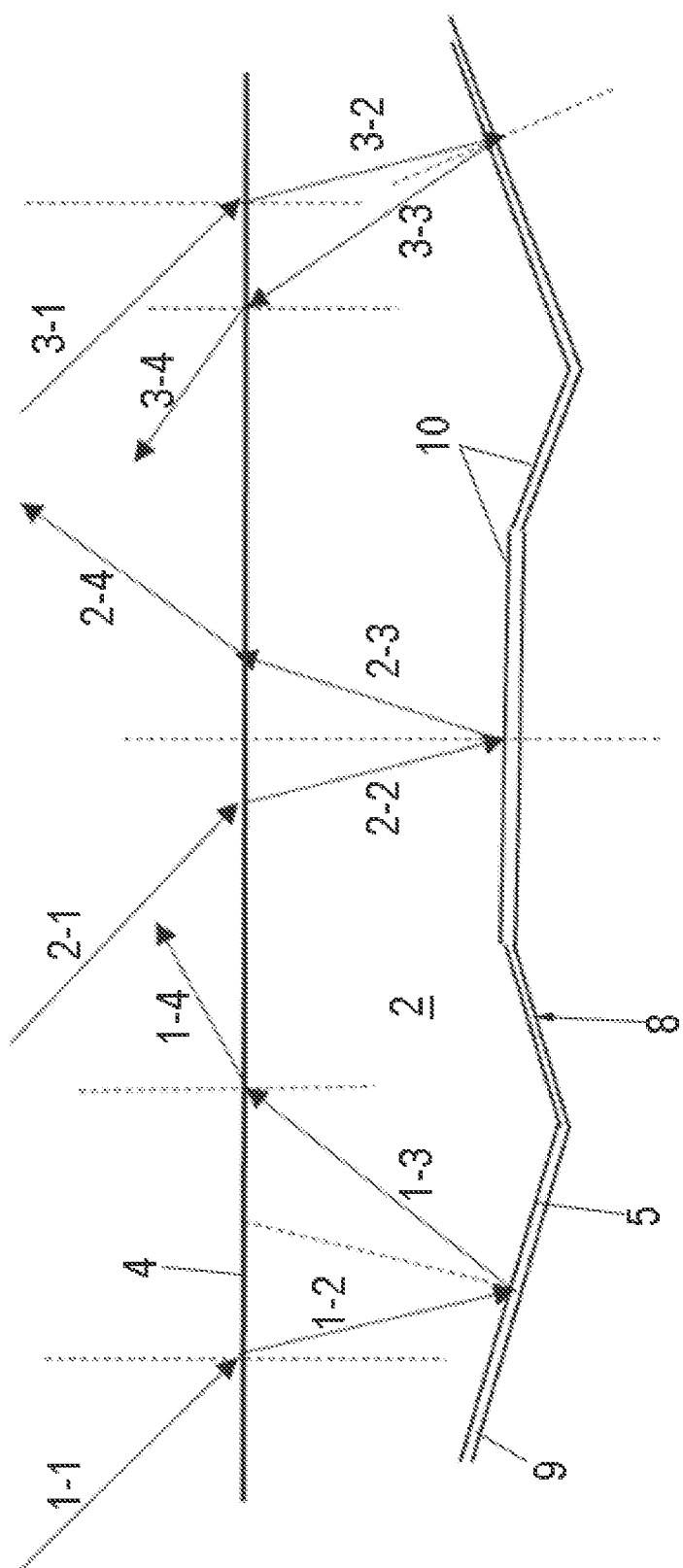
FIG. 23 a schematic representation of exemplary light paths upon reflection at the coloring first pane of the facade element of FIG. 22.

FIG. 23 shows three different light paths as examples. The reflection of the light beams at the interference layer 9 is again shown in simplified form. Due to the differently inclined segments 10, the light rays are reflected differently from the color-giving first pane 2. A first light beam 1-1 impinges on the front surface 4 of the coloring first pane 2, traverses the coloring first pane 2 as a refracted light beam 1-2, is reflected as a light beam 1-3 from a segment 10 inclined to the plane of the coloring first pane 2, and emerges as a refracted light beam 1-4 from the coloring first pane 2 toward the external environment. In a corresponding manner, a second light beam 2-1 impinges on the front surface 4 of the coloring first pane 2, traverses the coloring first pane 2 as a refracted light beam 2-2, is reflected as a light beam 2-3 from a segment 10 parallel to the plane of the coloring first pane 2, and emerges as a refracted light beam 2-4 from the coloring first pane 2 toward the external environment. In a corresponding manner, a third light beam 3-1 impinges on the front surface 4 of the coloring first pane 2, traverses the coloring first pane 2 as a refracted light beam 3-2, is reflected as a light beam 3-3 by a segment 10 inclined to the plane of the coloring first pane 2, and emerges as a refracted light beam 3-4 from the coloring first pane 2 toward the external environment. Only for the middle segment 10 is the condition incident angle=reflection angle, i.e., reflection at the gloss angle, fulfilled for the incident light beam 2-1 and outgoing light beam 2-4. The other light beams are each reflected by the segments 10 at the local gloss angle, which, however, does not correspond to the gloss angle of the plane of the color-giving first pane 2, so that relatively strong scattering occurs. In conjunction with the optical interference layer 9, a homogeneous color effect for the facade element 1 that is not very direction-dependent can be achieved.

Figure 24:
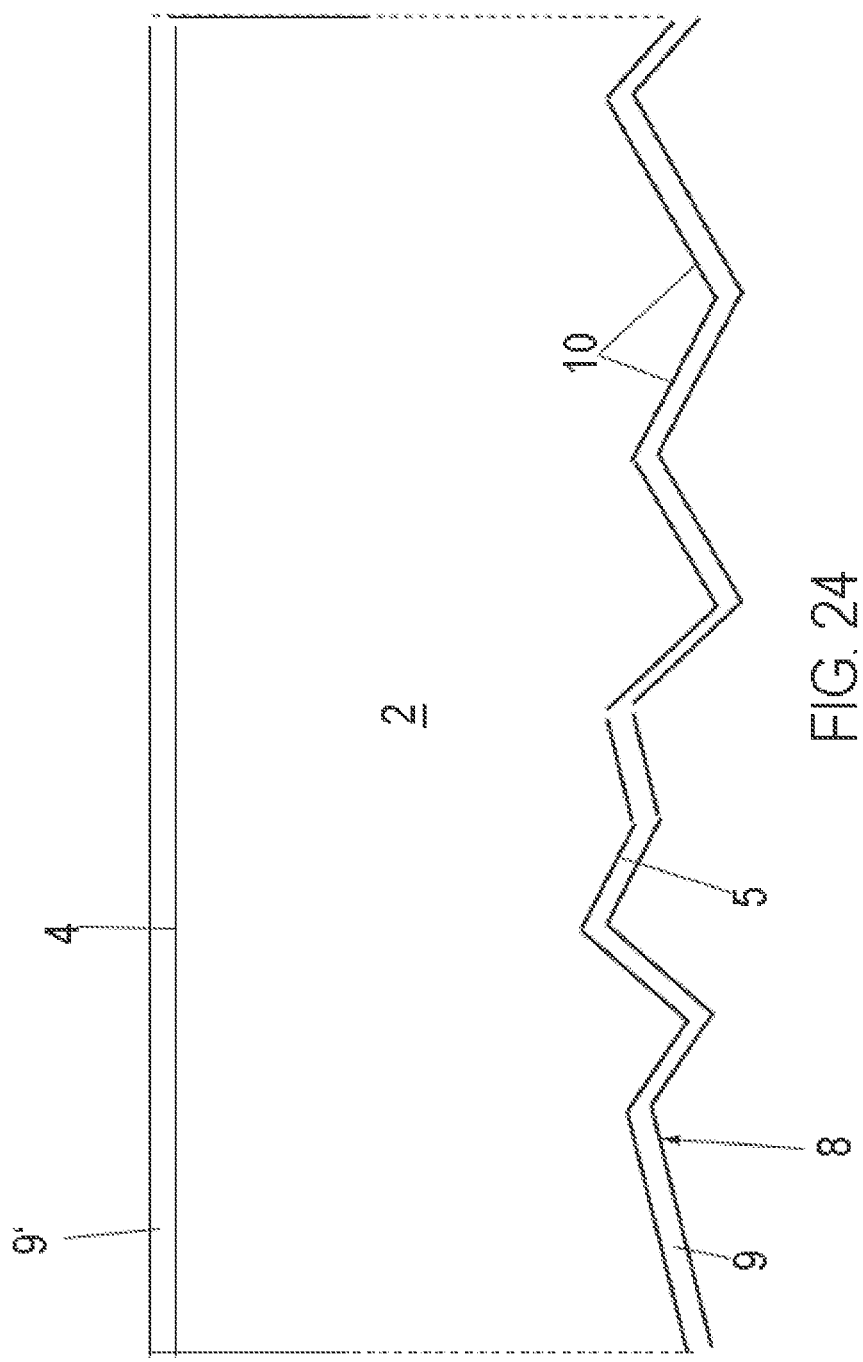
FIGS. 24-25 schematic cross-sectional views of further embodiments of the coloring first pane of the facade element according to the invention.

FIG. 24 illustrates a further embodiment of the facade element 1 according to the invention, in which only the color-providing first pane 2 is shown. In order to avoid unnecessary repetitions, only the differences are described and otherwise reference is made to the above explanations. Accordingly, the facade element 1, in addition to the optical interference layer 9 on the structured region 8 of the back surface 5 of the coloring first pane 2, has a further optical interference layer 9' directly on the front surface 4 of the coloring first pane 2. The front surface 4 is not structured, i.e., does not have a structured region 8 analogous to the back surface 5. Rather, the front surface 4 is smooth within the limits of production inaccuracies. The two interference layers 9, 9' may have the same or different optical refractive index and the same or different layer thickness. If an equal optical thickness n*d is chosen for the two optical interference layers 9, 9', the color of the solar module 1 can be enhanced because the light reaching the observer passes through an optical interference layer three times in total and is therefore more filtered. In the case of coatings with significantly different optical thicknesses, mixed colors can be generated.

If the front surface 4 of the color-generating first pane 2 is coated with an optical interference layer 9' consisting of an inorganic, chemically inert and hard layer such as $Si_3N_4$, for example, a high scratch resistance, chemical resistance and dirt-repellent effect is obtained for the facade element 1. The use of photocatalytic layers such as $TiO_2$ can also result in a self-cleaning effect.

Such an additional layer arranged on the front surface 4 may also be a thin anti-reflective layer having an optical refractive index smaller than that of the coloring first pane 2, thereby suppressing the substantially white reflection of the coloring first pane 2 (e.g., glass) and increasing the degree of saturation of the colors.

Figure 25:
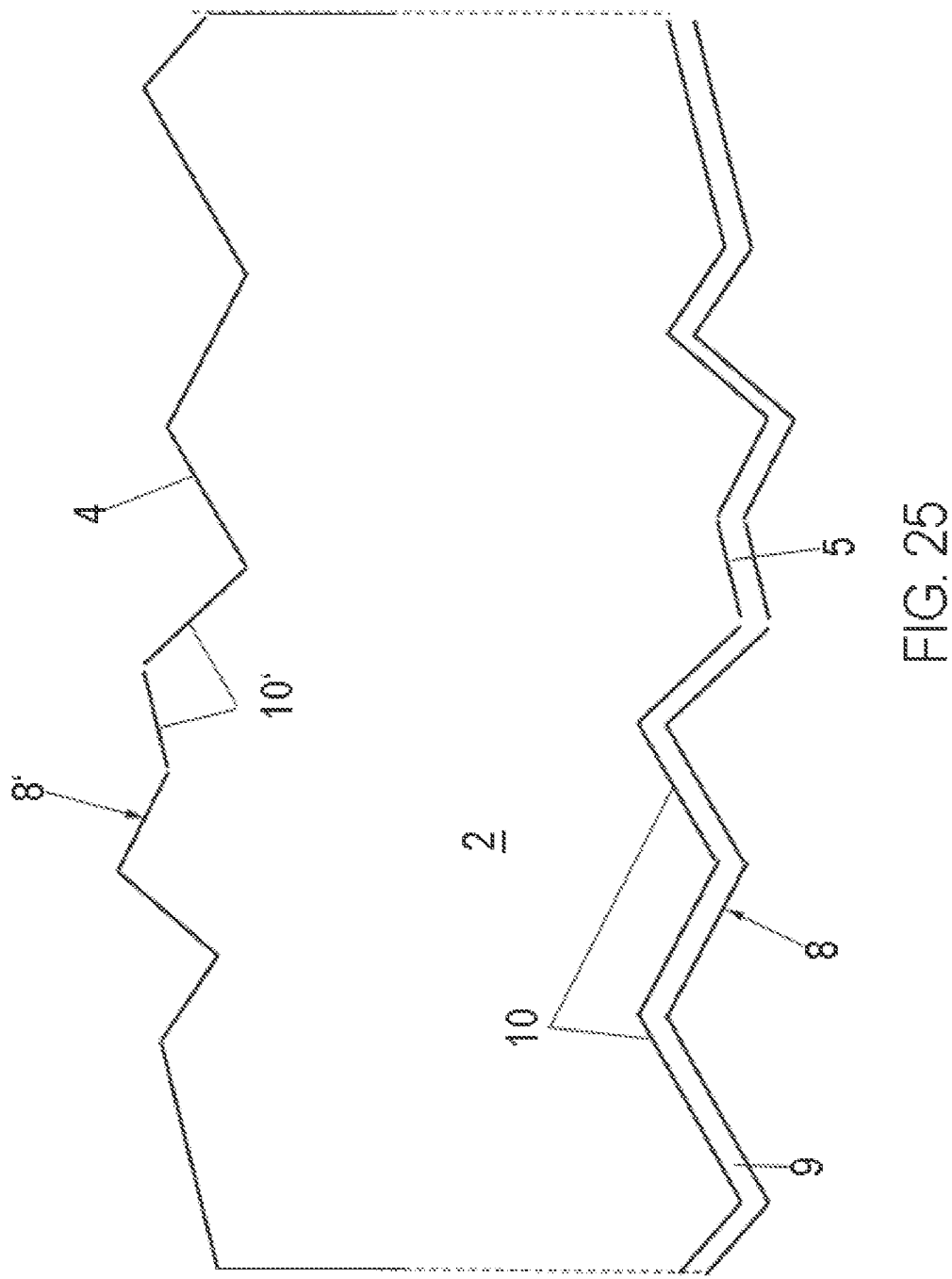

FIG. 25 illustrates a further embodiment of the facade element 1 according to the invention, in which only the coloring first pane 2 is shown. In order to avoid unnecessary repetitions, only the differences are described and otherwise reference is made to the above explanations. Accordingly, the back surface 5 of the coloring first pane 2 of the facade element 1 has a structured region 8 on which an optical interference layer 9 is arranged. Furthermore, the front surface 4 of the coloring first pane 2 also has a structured region 8'. No optical interference layer is arranged on the front surface 4. The two structured regions 8, 8' can be the same or different from each other. In the embodiment example of FIG. 25, all segments 10 have an angle of inclination of 45° at most. In contrast to the segments 10 of the structured region 8 of the back surface 5, there is no condition for roughness for the segments 10' of the structured region 8' of the front surface 4 of the facade element 1 of FIG. 25.

Such an additional layer arranged on the front surface 4 may also be a thin, color-neutral anti-reflective layer having an optical refractive index smaller than that of the coloring first pane 2, thereby suppressing the substantially white reflection of the coloring first pane 2 (e.g., glass) and increasing the degree of saturation of the colors. However, an additional layer arranged on the front surface 4 can also have the same optical refractive index as the coloring first pane 2. In this case, the layer serves only to protect the coloring first pane 2 from moisture and other corrosive components of the air. Etched satinized glasses have been shown to be more sensitive to moist heat than planar or rolled glasses. In the case of etched soda-lime glass, the additional layer may be, for example, a thin sputtered $SiO_2$ layer.

In these embodiments, the light must pass at least once through the coloring first pane and must be reflected by the internal interference layer in order to achieve the desired coloration with the improved angular stability after exiting the front surface.

In principle, the facade element 1 can be mounted on a facade by any suitable fastening technique, for example back rails, drilled point holders, clamping strips, etc. Suspension systems are frequently used in back-ventilated curtain walls, in which the joint is realized by means of a form closure.

Figure 26:
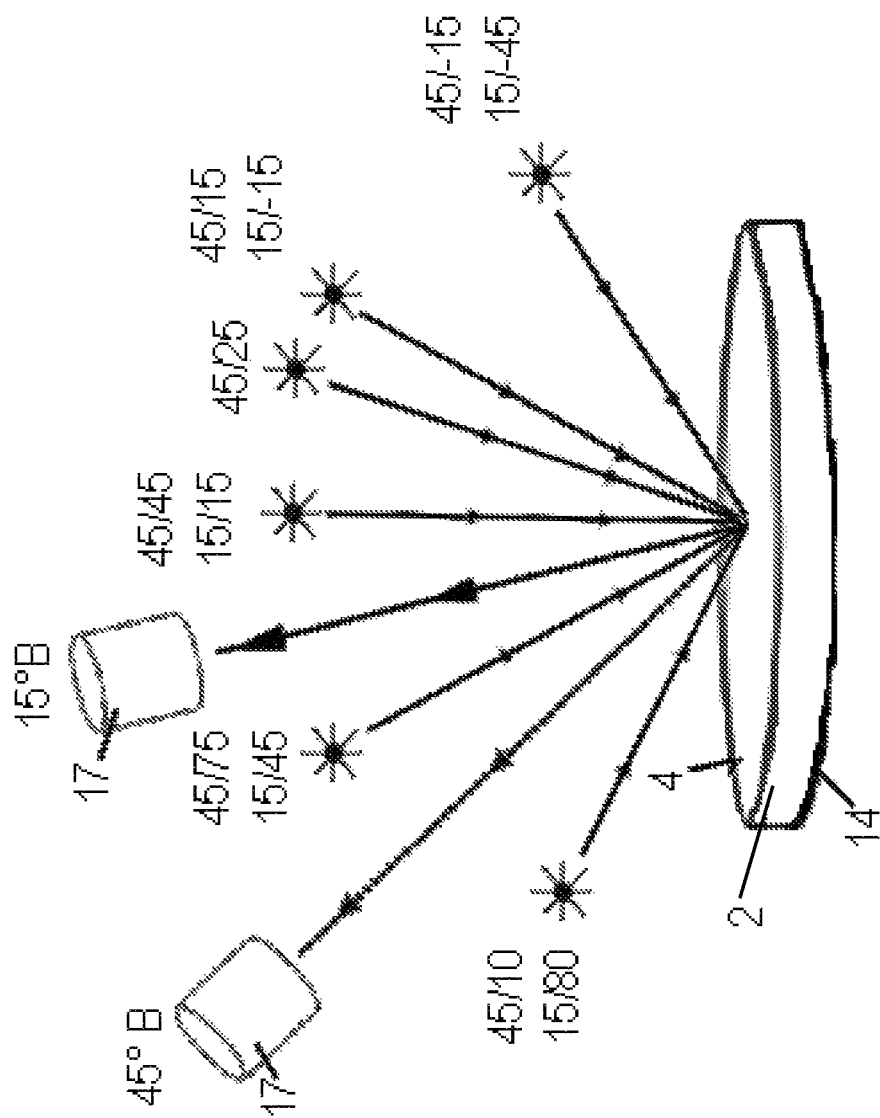
FIG. 26 a schematic representation of the method for multi-angle color measurement.

FIG. 26 illustrates the measuring arrangement for determining the diffuse scattering of the facade element 1 according to the invention using a commercially available multi-angle colorimeter 17 (multi-angle color measurement). The structured region 8, which is not shown in more detail, extends over the complete color-providing first pane 2 (e.g., glass). Here, a light beam is directed onto the front surface 4 of the facade element 1 to be characterized at different angles of incidence and the scattered or reflected light is spectrally measured from different observation angles, for example 15° or 45° to the normal of the plane of the coloring first pane 2. Beneath the coloring first pane 2 is an opaque back element 14, which is formed here, for example, as a black, non-glossy layer (e.g., bonded with a liquid having a refractive index at about 1.5). The multi-angle colorimeter 17 can be used to determine the brightness in the L-a-b system with D65 standard illumination and 10° aperture angle. It has been shown that good angular stability (i.e., low angular dependence of the scattered light) is provided when both at 45° and at 15° angle of observation and at an angle of incidence of 45°, each measured from the gloss angle, there is still at least a brightness of L=10, preferably L=15 and even better L=20. Due to the at least one structured region 8 of front surface 4 and/or back surface 5 of the color-giving first pane 2, at least a brightness of L=10 can be achieved both at 45° and at 15° angle of observation and at an angle of incidence of 45°, in each case measured from the gloss angle (in both directions). The degrees are to be understood as follows: reflection angle (referred to surface normal/incidence angle (referred to gloss angle). For example, with an observation angle of 45° (measured relative to the surface normal) and an incidence angle of 45° (measured from the gloss angle), the incident beam is incident exactly perpendicular to the surface (45/45). With an angle of observation of 15° and an angle of incidence of 45°, the direction of incidence is 30° from the normal on the same side as the direction of observation (15/45). The multi-angle colorimeter 20 is positioned relative to the normal at an observation angle of 45° or 15°.

In all embodiments of the facade element according to the invention with a photovoltaically active back element, the electrically active region is advantageously located behind the protective outer skin of the composite pane comprising the first pane and the second pane.

Visually disturbing components remain hidden behind the opaque masking layer. Mechanical components, such as junction boxes and cables, can remain in their usual position behind the back of the solar module. The production of the solar modules remains largely unchanged, with only the lamination of the front glass being omitted or the finished solar module being laminated with another pane (coloring glass element or mechanically supporting glass element). Frames or back rails are not required. Several solar modules can be laminated onto the larger composite element and connected via cables if the panel, infill or window element is to achieve region dimensions as in high-rise construction.

In the embodiments of FIGS. 3 and 4, the coloring is stronger because the coloring glass element is on the outside of the facade. In the embodiment of FIG. 5, the coloring glass element is on the inside and is therefore more protected. If only one solar module of suitable size is to be used, this can also be a solar module from series production that has already been manufactured with a textured and coated glass element. If several solar modules are to be installed in an infill, then it is more advantageous to use a large designing glass element, since the spaces in between can then be covered with opaque layers.

The modular design separates the different functions and each glass element can be optimized for itself: the coloring glass element is optimized with regard to the desired coloring with the least possible loss of efficiency, the mechanically supporting glass element is dimensioned and post-treated (post-beam facade, single pane safety glass) in such a way that it meets the mechanical requirements with regard to the dead weight of the composite with respect to wind load. The solar module can be largely taken from standard production.

The variants according to the invention as shown in FIGS. 3 and 5 have the advantage that carrier substrates with solar cells can be integrated in back-ventilated facade elements, post-beam constructions or window elements. In each case, the color-giving glass element can be produced independently of the required thickness of the mechanically supporting glass element. The mechanically supporting glass element is dimensioned according to the required structural analysis (total weight of the composite element and wind load bearing capacity).

In the variant of FIG. 4, the manufacturing processes, but also certain warranties, can be advantageously separated by supply chain. The solar module manufacturer delivers a fully electrically tested and sealed solar module.

Although module performance is somewhat reduced by laminating onto a thicker glass, this can be minimized to negligible values by using white glass. For white glass with a low iron content, the transmission between 4 mm and 12 mm glass thickness only decreases from 91% to 90%.

The colored facade element consisting of a coloring glass element, a mechanically supporting glass element with or without a photovoltaically active back element can be combined with various common designs for curtain-type back-ventilated facades, element facades or post-beam facades or large window elements. In the case of a post-beam facade or element-facade or use as a window element, there can optionally be at least one additional glass pane or another cover made of a different material behind the back side of the solar modules, which close off the facade element from the room side. The junction box and cables are then located between the solar module and the room-side cover. If the room-side cover is a glass pane, both can be designed together with a suitable frame and seals according to the state of the art as an insulating glass, facade element or as a window element with gas filling. This is shown by way of example in FIG. 8. The outer pane of a conventional insulating glass window is replaced by the colored laminated pane structure. The cables must then be led out of the frame. It is also possible to use two additional panes on the room side as triple glazing.

The laminated glass structure and the room-side cover are connected with suitable spacers (because of junction box and cables) and adhesive seals without a frame and are connected together as a package with line brackets or point brackets to the post-beam supporting structure. The cables must be led out through the spacers or through the room-side cover. Between the room-side cover and the solar module there can also be a heat-insulating material (foamed plastics such as polystyrene (Styrofoam), mineral fibers, glass wool, etc.). The room-side cover can also be hung on fasteners located in the supporting glass element. Then the room side cover can be removed for maintenance.

In the case of a window element with a solar panel, the color-giving glass element can also be chosen to be much smaller than the mechanically supporting glass element. The infill or window element then consists of a transparent region (window) and an opaque colored region that is either photovoltaically active or can be fully or partially passive, as shown in FIG. 7.

The facade element can also be used as a pane of a back-ventilated curtain wall. In contrast to the currently used module with back rail, the composite pane structure can be integrated into common constructions for glass without back rail due to the mechanical reinforcement by means of the mechanically supporting glass element. Line supports, point supports or mechanical clamps can be used for this purpose. The solar module and the color-giving glass element only contribute to a small extent to achieving the wind load bearing capacity. The essential mechanical core is the mechanically supporting glass element.

As can be seen from the above description of the invention, the invention provides an improved facade element that has a very homogeneous, intense color, with little or no directionality. The facade element can be manufactured cost-effectively in various shapes and sizes and can be integrated into a facade in a simple manner. Particularly advantageously, the facade element has a particularly high mechanical strength so that it can withstand higher wind loads. The invention thus provides an innovation which brings considerable advantages in the practice of facade construction.

What is claimed is:

1. A facade element, comprising a coloring transparent or semi-transparent first pane and a mechanically supporting transparent second pane firmly connected to one another by a first intermediate layer, wherein the coloring transparent or semi-transparent first pane has a front surface arranged on a light incidence side and an opposite back surface, wherein at least one surface selected from the front surface and the back surface has at least one structured region, wherein at least one optical interference layer is arranged on the at least one surface selected from the front surface and the back surface for reflecting light within a predetermined wavelength range, wherein the at least one structured region has the following features:

perpendicular to a plane of the coloring transparent or semi-transparent first pane, a height profile comprising peaks and valleys, wherein an average height difference between the peaks and the valleys is at least 2 µm, at least 50% of the at least one structured region is composed of segments being inclined with respect to the plane of the coloring transparent or semi-transparent first pane, wherein, with respect to the plane of the coloring transparent or semi-transparent first pane, at least 20% of the segments have an angle of inclination in a range from greater than 0° to a maximum of 15° and at least 30% of the segments have an angle of inclination in a range from greater than 15° to a maximum of 45°, wherein the segments are each planar and have a segment area of at least 1 μm², wherein the segments each have an average roughness of less than 15% of a layer thickness of the at least one optical interference layer;

wherein an optical interference layer of the at least one optical interference layer for reflecting light within the predetermined wavelength range is arranged on the back surface of the coloring transparent or semi-transparent first pane, wherein the back surface and/or the front surface each have the at least one structured region, wherein either the front surface has the at least one structured region or a further optical interference layer of the at least one optical interference layer for reflecting light within the predetermined wavelength range is arranged on the front surface; and wherein
i) the back surface of the coloring transparent or semi-transparent first pane has no structured region and the front surface has the at least one structured region, wherein no optical interference layer is arranged on the front surface, or
ii) the back surface of the coloring transparent or semi-transparent first pane has the at least one structured region and the front surface has the at least one structured region, wherein no optical interference layer is arranged on the front surface, or
iii) the back surface of the coloring transparent or semi-transparent first pane has the at least one structured region and the front surface has no structured region, wherein no optical interference layer is arranged on the front surface, or
iv) the back surface of the coloring transparent or semi-transparent first pane has the at least one structured region and the front surface has no structured region, wherein a further optical interference layer is arranged on the front surface.

2. The facade element according to claim 1, wherein the mechanically supporting transparent second pane is
i) thicker, or
ii) thinner
than the coloring transparent or semi-transparent first pane.

3. The facade element according to claim 1, wherein
i) the coloring transparent or semi-transparent first pane, or
ii) the mechanically supporting transparent second pane
is arranged on the light incidence side of the first intermediate layer.

4. The facade element according to claim 1, wherein at least one planar back element is attached to a back side of the facade element.

5. The facade element according to claim 4, wherein the at least one planar back element is suitable for photovoltaic energy generation.

6. The facade element according to claim 5, wherein the at least one planar back element suitable for photovoltaic energy generation comprises a carrier substrate with solar cells, wherein the carrier substrate, without an intermediate pane, is connected to the coloring transparent or semi-transparent first pane or the mechanically supporting transparent second pane by a second intermediate layer.

7. The facade element according to claim 5, wherein the coloring transparent or semi-transparent first pane or the mechanically supporting transparent second pane is a cover pane of a prefabricated solar module.

8. The facade element according to claim 5, wherein the at least one planar back element is smaller than the coloring transparent or semi-transparent first pane and the mechanically supporting transparent second pane.

9. The facade element according to claim 4, wherein the at least one planar back element is formed as:
an opaque coating of the rear-sided coloring transparent or semi-transparent first pane or the mechanically supporting transparent second pane,
an opaque film bonded to the rear-sided coloring transparent or semi-transparent first pane or the mechanically supporting transparent second pane by a first transparent adhesive film, or
an opaque rigid body connected to the rear-sided coloring transparent or semi-transparent first pane or the mechanically supporting transparent second pane by a second transparent adhesive film.

10. The facade element according to claim 1, wherein the front surface of the coloring transparent or semi-transparent first pane has the at least one structured region, and the at least one optical interference layer for reflecting light within the predetermined wavelength range is arranged on the at least one structured region.

11. The facade element according to claim 10, wherein
i) the back surface of the coloring transparent or semi-transparent first pane has no structured region and no optical interference layer, or
ii) the back surface of the coloring transparent or semi-transparent first pane has no structured region and a further optical interference layer is arranged on the back surface of the coloring transparent or semi-transparent first pane for reflecting light within the predetermined wavelength range, or
iii) the back surface of the coloring transparent or semi-transparent first pane has the at least one structured region, a further optical interference layer for reflecting light within the predetermined wavelength range is arranged on the at least one structured region.

12. The facade element according to claim 1, wherein a composite pane of the coloring transparent or semi-transparent first pane and the mechanically supporting transparent second pane is connected to at least one further pane via a spacer in order to form an insulating pane.

13. The facade element according to claim 2 wherein
i) the coloring transparent or semi-transparent first pane, or
ii) the mechanically supporting transparent second pane
is arranged on the light incidence side of the first intermediate layer.

14. The facade element according to claim 2, wherein at least one planar back element is attached to a back side of the facade element.

15. The facade element according to claim 3, wherein at least one planar back element is attached to a back side of the facade element.

16. The facade element according to claim 6, wherein the coloring transparent or semi-transparent first pane or the mechanically supporting transparent second pane is a cover pane of a prefabricated solar module.

17. The facade element according to claim 6, wherein the at least one planar back element is smaller than the coloring transparent or semi-transparent first pane and the mechanically supporting transparent second pane, relative to the plane of the coloring transparent or semi-transparent first pane and a plane of the mechanically supporting transparent second pane.

18. Use of the facade element according to claim 1 in a curtain wall back-ventilated facade, a post-beam facade, or a window facade.

\* \* \* \* \*